United States Patent [19]
Miyazaki et al.

[11] Patent Number: 5,777,722
[45] Date of Patent: Jul. 7, 1998

[54] SCANNING EXPOSURE APPARATUS AND METHOD

[75] Inventors: Seiji Miyazaki, Yokohama; Tsuyoshi Narabe, Ohmiya; Kei Nara; Tomohide Hamada, both of Yokohama; Kazuaki Saiki, Tokyo; Hideji Goto, Kawasaki; Muneyasu Yokota, Tokyo, all of Japan

[73] Assignee: Nikon Corporation, Tokyo, Japan

[21] Appl. No.: 654,382

[22] Filed: May 28, 1996

Related U.S. Application Data

[63] Continuation-in-part of Ser. No. 422,954, Apr. 17, 1995, abandoned.

[30] Foreign Application Priority Data

| Apr. 28, 1994 | [JP] | Japan | 6-114782 |
| May 16, 1994 | [JP] | Japan | 6-125691 |
| Jun. 2, 1995 | [JP] | Japan | 7-160063 |

[51] Int. Cl.$^6$ .................... G03B 27/42; G03B 27/32; G01B 11/00
[52] U.S. Cl. .................... 355/53; 355/77; 356/399; 356/400; 356/401
[58] Field of Search .................... 355/53, 55, 77; 250/548; 356/363, 375, 400, 401

[56] References Cited

U.S. PATENT DOCUMENTS

| 4,833,621 | 5/1989 | Umatate | 364/491 |
| 5,117,255 | 5/1992 | Shiraishi et al. | 355/53 |
| 5,194,893 | 3/1993 | Nishi | 355/53 |
| 5,214,489 | 5/1993 | Mizutani et al. | 356/363 |
| 5,448,332 | 9/1995 | Sakakibara et al. | 355/53 |
| 5,502,311 | 3/1996 | Imai et al. | 250/548 |
| 5,506,684 | 4/1996 | Ota et al. | 356/401 |
| 5,523,574 | 6/1996 | Hamada et al. | 250/492.2 |

FOREIGN PATENT DOCUMENTS

| 62-054434 | 3/1987 | Japan | H01L 21/30 |
| 62-136019 | 6/1987 | Japan | H01L 21/30 |
| 07234527 | 9/1995 | Japan | G03F 9/00 |

*Primary Examiner*—R. L. Moses
*Assistant Examiner*—Shival Virmani
*Attorney, Agent, or Firm*—Shapiro and Shapiro

[57] ABSTRACT

A scanning exposure apparatus is arranged to illuminate a mask, to project an image of the mask through a projection optical system onto a photosensitive substrate, and to move the mask and the photosensitive substrate relative to the projection optical system, thereby effecting exposure of an entire surface of the mask on the photosensitive substrate, and the exposure apparatus comprises a position detector which detects a relative positional relation between the mask and the photosensitive substrate; a memory which stores positional information obtained by the position detector; a position correcting device which corrects the relative positional relation between the mask and the photosensitive substrate, based on the positional information read out from the memory device; and a controller which makes the position detector detect the relative positional relation between the mask and the photosensitive substrate while the mask and the photosensitive substrate are carried past a projection region of the projection optical system to an exposure start position, and makes the position correcting device correct the relative positional relation between the mask and the photosensitive substrate, based on the positional information read out from the memory, while the mask and the photosensitive substrate are stopped at the exposure start position and/or during the exposure.

34 Claims, 13 Drawing Sheets

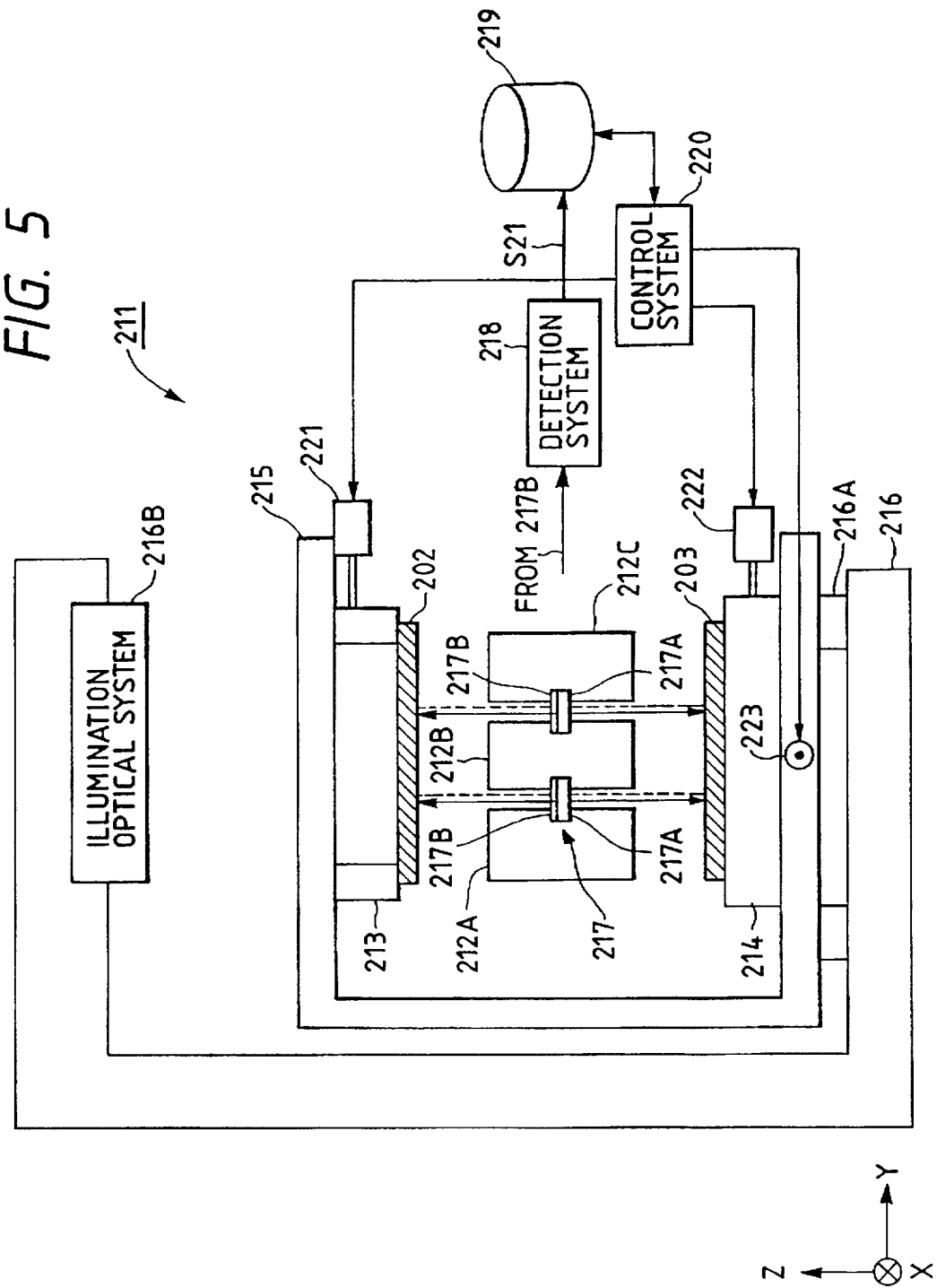

SIGNAL WAVEFORM OBTAINED FROM APPROPRIATE IMAGE QUALITY

SIGNAL WAVEFORM OBTAINED FROM IMAGE QUALITY HAVING FOCUSING ERRORS

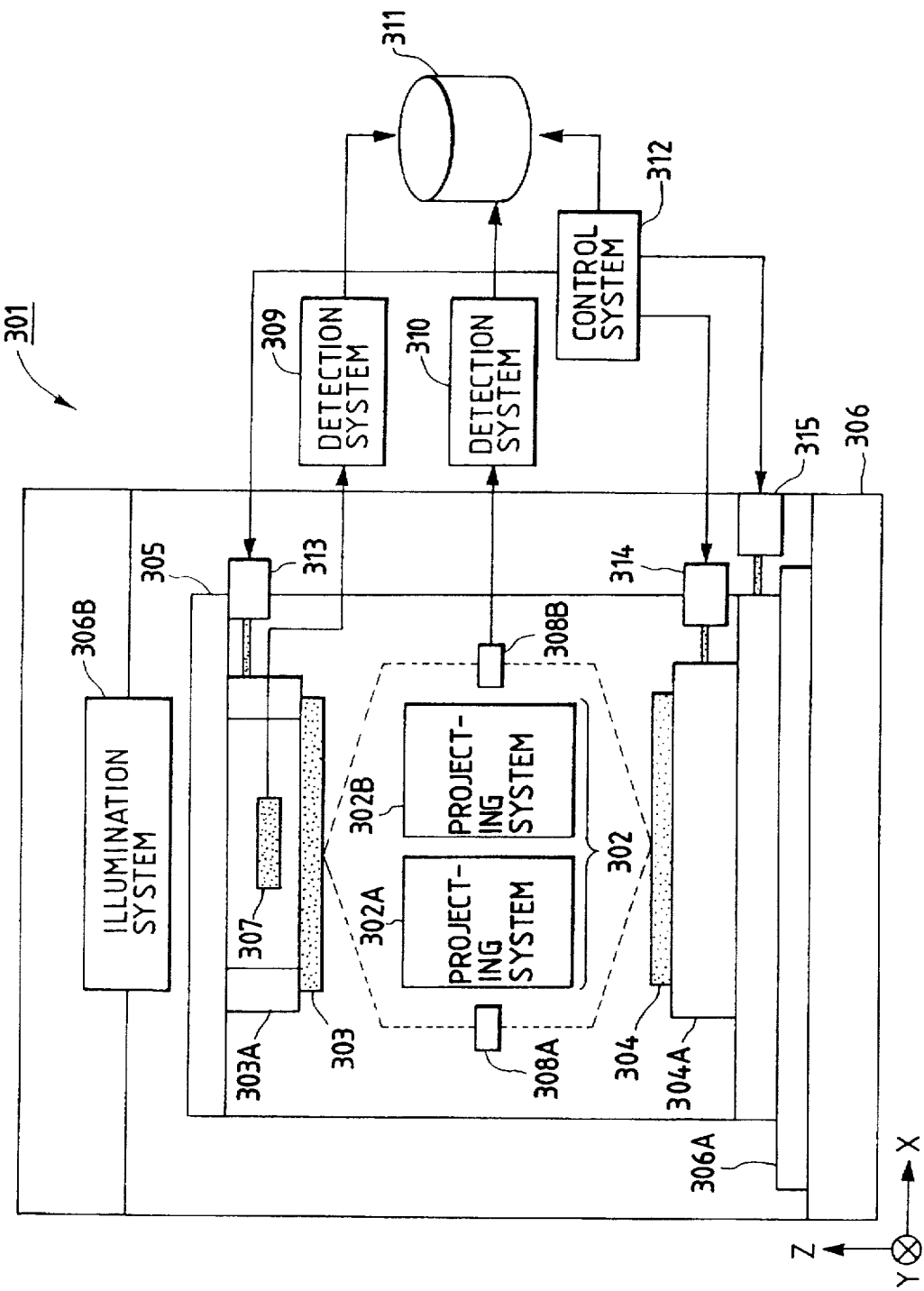

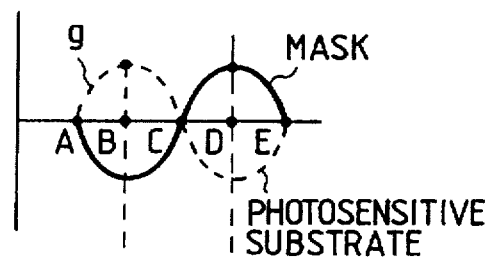
FIG. 15A  AT INITIAL STATE
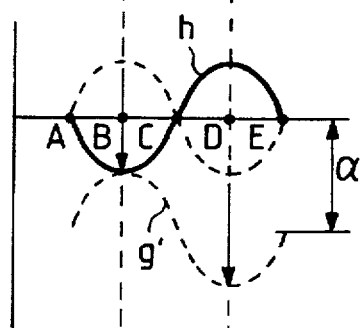
FIG. 15B  AFTER FOCUSING CONTROL AT THE FIRST ALIGNMENT POSITION
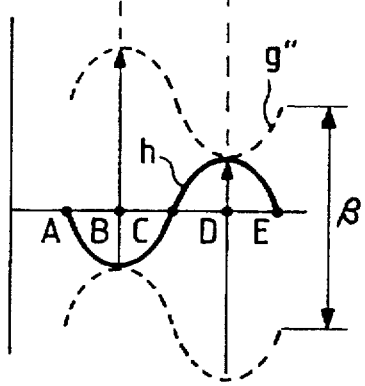
FIG. 15C  AFTER FOCUSING CONTROL AT THE SECOND ALIGNMENT POSITION
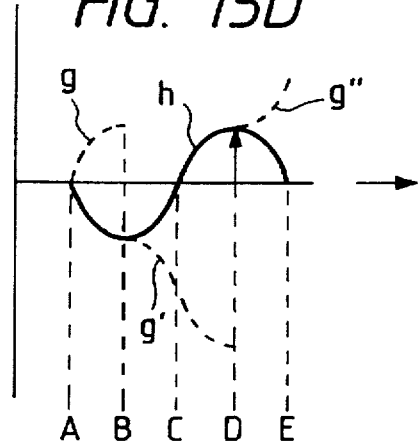
FIG. 15D
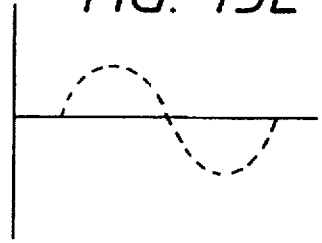
FIG. 15E

SCANNING EXPOSURE APPARATUS AND METHOD

This application is a continuation-in-part of application Ser. No. 08/422,954 filed Apr. 17, 1995, now abandoned.

BACKGROUND OF THE INVENTION

1. Field of the Invention

The present invention concerns a scanning exposure apparatus and method, and more particularly, relates to a scanning exposure apparatus and method suitably used in fabricating, for example, liquid crystal display devices.

2. Related Background Art

Conventional exposure apparatus of this type employ a method for detecting during scanning exposure a relative position between a mask and a photosensitive substrate in in-plane directions and a position along the optical axis of a projection optical system and correcting positioning of the relative position (alignment operation) and positioning along the optical axis (focus operation) at the same time (that is, in real time). Namely, they employ the method for effecting exposure of patterns formed on the mask to the photosensitive substrate while correcting a relative positional relation between the mask and the photosensitive substrate during scanning exposure.

This method, however, sometimes showed such a problem that the correction operation was delayed relative to an input result or a detection result because of factors caused by the apparatus itself (for example, mechanical responsibility or accuracy of control system) or factors caused by materials (for example, a steep change of flatness of mask or photosensitive substrate itself), so that the correction operation failed to follow a scanning speed. In such cases, the positional relation between the mask and the photosensitive substrate could not be always kept within a good accuracy range, which raised a possibility that operational faults of a device were caused due to a local decrease of resolution.

A local steep change is likely to appear in the flatness of a mask or a photosensitive substrate, for example, because of variations of thickness thereof, deformation, particularly of the photosensitive substrate, due to thermal treatment, foreign materials intruding into between the photosensitive substrate and a support surface, etc. When such a change appeared, there was a possibility that the resolution was decreased because a time between detection of a change amount and position correction by a drive system did not match the scanning speed.

If measuring points used for detection of an amount of correction are provided within an exposure region, the amount of correction can be directly obtained from measured values thereat; but, where the measuring points need to be provided outside the exposure region, the amount of correction is an estimate from the measured values to the last, which thus raised a possibility that the amount of correction could not match with a steep change.

It is conceivable that the scanning speed is reduced in order to avoid such a problem. However, this method inevitably caused a decrease in throughput (i.e., processing performance).

Also, control of the exposure apparatus of this type is becoming complex with progress of fine pattern technology. As one of the control technology there is known leveling technology for correcting a position of the focal point of projection optical system or errors such as asperities formed in the photosensitive substrate, by moving the photosensitive substrate to a proper position.

Incidentally, as for the focal length of a projection optical system 1, the entrance-side focal length d1 and the exit-side focal length d2 both are constant as shown in FIG. 1. Therefore, in order to accurately transfer the patterns formed on the mask 2, a separation between the mask 2 and the photosensitive substrate 3 must be maintained to be an appropriate, constant interval during scanning exposure.

It is, however, rare that a mask surface 2A and a photosensitive substrate surface 3A both are given in an ideal state, but they commonly include asperities more or less. Thus, the separation between the mask and the photosensitive substrate would change depending upon the position if the scanning exposure were made without taking account of the asperities. Namely, even if the mask and photosensitive substrate are kept at an average interval, the separation between the mask and the photosensitive substrate locally changes depending upon the position because of the asperities of surfaces (which means that the mask and the photosensitive substrate become not conjugate with each other with respect to the projection optical system).

In addition, if the scanning exposure apparatus is one of a scanning exposure method for effecting scanning exposure of a large area at one time with a plurality of projection optical systems arranged in array, variations of focal lengths thereof are added, which makes it still more difficult to keep the mask conjugate with the photosensitive substrate in the entire exposure region. This state is shown in FIG. 2.

As described, there was a problem that the separation between the mask 2 and the photosensitive substrate 3 varied during scanning exposure.

Furthermore, in an operation for measuring a relative positional relation between the mask and the photosensitive substrate (alignment measurement) at arbitrary positions during carrying of the mask and the photosensitive substrate to an exposure start position, if errors are generated in the relative positional relation between the mask and the photosensitive substrate in the direction of the optical axis (focusing errors), there is a possibility of errors in alignment results arising as described below due to said focusing errors.

For example, when an alignment method of the image processing scheme is employed, the image of a mark as indicated by the hatched portion a in FIG. 11A can be obtained if after a proper focusing control is performed, and an output waveform of an alignment sensor having a clear rise and decay edges as shown in FIG. 11B can be obtained. However, if there are imaging errors, only an image can be obtained corresponding to this from a signal processing area b. However, if there are focusing errors, only an image out of focus as indicated by c in FIG. 11A can be obtained and, correspondingly, the edge portions become sloping, as shown in FIG. 1C, so as to obtain only an indistinct waveform from the signal processing area b. In this case, the edge positions of the image are detected to be different due to the sloping forms of the waveform so that errors arise in detection results of the mark position.

Also, in the event either the laser scheme or the image processing scheme is adopted for the alignment method, if the illumination light flux has such an ideally-adjusted inclination relative to the optical axis as indicated by the dotted-line arrow e, as shown in FIG. 12, no error is generated in the positional measurement of the mark M even if there are focusing errors. However, if the illumination light flux has the inclination error θ relative to the optical axis as indicated by the solid-line arrow f, there arises the error ΔL in positional measurement of the mark M corresponding to said inclination error θ and the focusing errors. This inclination error θ relative to the optical axis is sometimes purposely given in a non-measurement direction not only when the control is insufficient, but also when the laser beams are used.

SUMMARY OF THE INVENTION

An object of the present invention is to provide a scanning exposure apparatus which can perform exposure while correcting a relative positional relation between the mask and the photosensitive substrate to an appropriate positional relation still at high throughput even with an unpredictable change of flatness.

Another object of the present invention is to provide a scanning exposure apparatus which can perform scanning exposure while controlling the separation between the mask and the photosensitive substrate in the exposure region so as to be always kept at an interval suitable for exposure.

Still another object of the present invention is to provide a scanning exposure apparatus which can perform excellent exposure of patterns of the mask on the photosensitive substrate while maintaining a high throughput even when a sharp change arises in the inclination adjustment error of the illumination light flux relative to the optical axis or the flatness thereof.

To achieve the above objects, a first aspect of the present invention provides a scanning exposure apparatus, which is arranged to illuminate a mask, to project an image of the mask through a projection optical system onto a photosensitive substrate, and to move to scan the mask and the photosensitive substrate relative to the projection optical system, thereby effecting exposure of an entire surface of the mask on the photosensitive substrate, and which comprises: a position detector which detects a relative positional relation between the mask and the photosensitive substrate; a memory which stores positional information obtained by the position detector; a position correcting device which corrects the relative positional relation between the mask and the photosensitive substrate, based on the positional information read out from the memory means; and a controller which makes the position detector detect the relative positional relation between the mask and the photosensitive substrate while the mask and the photosensitive substrate are carried past a projection region of the projection optical system to an exposure start position, and makes the position correcting device correct the relative positional relation between the mask and the photosensitive substrate, based on the positional information read out from the memory, while the mask and the photosensitive substrate are stopped at the exposure start position and/or during the exposure.

It is preferred that the positional information comprise first positional information related to a direction perpendicular to an optical axis of the projection optical system and second positional information related to a direction of the optical axis of the projection optical system. In this case, it is preferred that the first positional information be a relative position between the mask and the photosensitive substrate and that the second positional information be a relative position in the direction of the optical axis between the mask and the photosensitive substrate and an amount of relative inclination between the mask and the photosensitive substrate.

Preferably, the controller should control the position correcting device, based on the relative position between the mask and the photosensitive substrate while the mask and the photosensitive substrate are stopped at the exposure start position, thereby correcting the positional relation related to the direction perpendicular to the optical axis of the projection optical system out of the positional relation between the mask and the photosensitive substrate and wherein during the exposure, the controller controls the position correcting device, based on the relative position related to the direction of the optical axis between the mask and the photosensitive substrate and/or the amount of relative inclination between the mask and the photosensitive substrate, thereby correcting the positional relation related to the direction of the optical axis of the projection optical system out of the positional relations between the mask and the photosensitive substrate.

It is preferred that the memory retain a data map obtained based on the positional information at arbitrary positions in the scan direction, detected by the position detector.

It is preferred that the position correcting device preliminarily correct the positional relation between the photosensitive substrate and the mask while stopped at the exposure start position, so as to be coincident with an average surface of the photosensitive substrate to be present relative to the surface of the mask or with an average surface of the mask to be present relative to the surface of the photosensitive substrate, as obtained based on the positional information read out from the data map.

Further, it is also preferred that the position correcting device produce a correction map representing correction values at the arbitrary positions based on the positional information read out from the data map, and successively correct the positional relation between the mask and the photosensitive substrate in accordance with the correction map during the exposure; or, it is also preferred that the position correcting device produce a correction map representing correction values at the arbitrary positions based on the positional information read out from the data map, and successively correct the positional relation between the mask and the photosensitive substrate in accordance with the correction map and positional information detected in real time by the position detector, during the exposure.

In the first aspect of the present invention as described above, the relative positional relation between the mask and the photosensitive substrate is preliminarily detected while being carried to the exposure start position and the relative positional relation between the mask and the photosensitive substrate is corrected during exposure while reading the preliminarily detected positional information out of the memory means, whereby exposure can be made without a possibility of occurrence of imaging errors and without lowering the throughput even if the mask and the photosensitive substrate used include steep changes which are unpredictable in the conventional method for simultaneously carrying out measurement and correction of the relative positional relation between the mask and the photosensitive substrate during exposure scanning.

In this case, the positional information detected by the position detecting means is the first positional information related to the direction perpendicular to the optical axis of the projection optical system and the second positional information related to the direction of the optical axis of the projection optical systems, whereby the positioning accuracy can be enhanced and the possibility of imaging errors can be further decreased.

Further, the first positional information is the relative position between the mask and the photosensitive substrate, and the second positional information is the relative position related to the direction of the optical axis between the mask and the photosensitive substrate and the amount of relative inclination between the mask and the photosensitive substrate, whereby the relative positional relation can be corrected efficiently.

Since the apparatus is so arranged that while the mask and the photosensitive substrate are stopped at the exposure start position, the positional relation related to the direction perpendicular to the optical axis of the projection optical system is corrected based on the relative position between the mask and the photosensitive substrate and that after scanning of the mask and the photosensitive substrate is started, the positional relation related to the direction of the optical axis of the projection optical system is corrected based on the relative position in the direction of the optical axis between the mask and the photosensitive substrate and/or the amount of relative inclination between the mask and the photosensitive substrate, scanning exposure can be made without lowering the throughput and without including imaging errors.

Also, the memory means retains the data map produced based on the relative positional relation at arbitrary positions in the scan direction, so that the relative positional relation between the mask and the photosensitive substrate does not have to be measured again during exposure, thereby achieving an improvement in scanning speed during exposure.

Further, the positional relation between the photosensitive substrate and the mask is preliminarily corrected before start of scan so as to be coincident with an average surface of photosensitive substrate to be present relative to the surface of the mask or an average surface of mask to be present relative to the surface of the photosensitive substrate as obtained based on the positional information read out from the data map, whereby the scanning speed during exposure can be further improved and the throughput can be improved.

Also, the correction map indicating correction values at arbitrary positions is produced based on the positional information read out form the data map and the positional relation between the mask and the photosensitive substrate is successively corrected during exposure in accordance with the correction map, whereby the positional relation between the mask and the photosensitive substrate can be corrected in an optimum state and the resolution can be enhanced remarkably.

Further, the correction map representing correction values at arbitrary positions is produced based on the positional information read out from the data map and the positional relation between the mask and the photosensitive substrate is successively corrected during exposure in accordance with the correction map and positional information detected in real time by the position detecting means, whereby the control according to the control map can be executed more certainly.

A second aspect of the present invention provides a scanning exposure apparatus, which is arranged to illuminate a plurality of regions on a mask, to project respective images of the plurality of regions through a plurality of projection optical systems onto a photosensitive substrate, and to move to scan the mask and the photosensitive substrate relative to the plurality of projection optical systems, thereby effecting exposure of an entire surface of the mask on the photosensitive substrate, and which comprises: a measuring device which measures, prior to the exposure, a relative separation between the mask and the photosensitive substrate at each of arbitrary positions on the mask and the photosensitive substrate; a memory which stores the relative separations measured by the measuring device and the positions in connection therewith; a position correcting device which drives the mask and/or the photosensitive substrate to correct a relative positional relation between the mask and the photosensitive substrate; and a controller which controls the position correcting device during the exposure, based on the relative separations and the positions stored, so that the relative separations between the mask and the photosensitive substrate, related to the plurality of regions from which an image of the mask is projected, satisfy a predetermined relation.

It is preferred that the memory stores information related to positions of respective image planes of the plurality of projection optical systems with respect to a scan direction of the mask and the photosensitive substrate and that the controller performs the control, based on a difference between focal lengths of the plurality of projection optical systems. Also, it is preferred that the position correcting device have a drive direction which is at least one of a direction perpendicular to a surface of the mask and/or a surface of the photosensitive substrate, a first rotational direction about a center axis of the scan direction, and a second rotational direction about a center axis of a direction perpendicular to the scan direction and the perpendicular direction.

In the second aspect of the present invention as described above, prior to exposure, a relative separation between the mask and the photosensitive substrate as illuminated by the plurality of projection optical systems is obtained at each of arbitrary positions and the relative separation between the mask and the photosensitive substrate is controlled to satisfy a predetermined relation, based on the relative separations, during scanning exposure, whereby the separation between the mask and the photosensitive substrate can be kept approximately constant.

Also, the information related to positions of respective image planes of the plurality of projection optical systems is preliminarily obtained in the scan direction and the positional relation between the mask and the photosensitive substrate is corrected based on differences between the focal lengths of the plurality of projection optical systems, whereby exposure pattern differences due to optical distance differences can be eliminated.

Also, the drive direction is set as at least one of the direction perpendicular to the surfaces of the mask and/or photosensitive substrate, the first rotational direction about the center axis of the scan direction, and the second rotational direction about the center axis of the direction perpendicular to the scan direction and the perpendicular direction, whereby the apparatus can be ready for quick correction at any position.

A third aspect of the present invention provides a scanning exposure apparatus, which is arranged to successively transfer patterns of a mask onto a photosensitive substrate through a projection optical system while synchronously moving the mask and the photosensitive substrate in a predetermined scan direction, and which comprises: a first position detector which detects a relative positional relation between the mask and the photosensitive substrate in a two-dimensional direction perpendicular to the optical axis of the projection optical system; a second position detector which detects a relative positional relation between the mask and the photosensitive substrate in the direction of the optical axis; a memory which stores first positional information serving as the information on the relative position between the mask and the photosensitive substrate in the two-dimensional direction perpendicular to the optical axis detected by the first position detector and second positional information serving as the information on the relative position between the mask and the photosensitive substrate in the direction of the optical axis detected by the second position detector; a first adjuster which adjusts the relative positional relation between the mask and the photosensitive substrate in the two-dimensional direction perpendicular to the optical axis; a second adjuster which adjusts the relative positional relation between the mask and the photosensitive substrate relative to the direction of the optical axis; a first controller which makes the second adjuster adjust the relative positional relation between the mask and the photosensitive substrate related to the direction of the optical axis at a predetermined alignment point while monitoring an output of the second position detector when the mask and the photosensitive substrate are carried past a projection area of the projection optical system to an exposure start position and thereafter makes the first detector detect the relative positional information between the mask and the photosensitive substrate in the two-dimensional direction perpendicular to the optical axis; and a second controller which makes the first adjuster adjust the relative positional relation between the mask and the photosensitive substrate in the two-dimensional direction particular to the optical axis, at least based on the first positional information at the predetermined alignment point stored in the memory, after the mask and the photosensitive substrate are carried to the exposure start position and before the exposure starts.

It is preferred that the scanning exposure apparatus further comprises a third controller which makes the second adjuster adjust the relative positional relation between the mask and the photosensitive substrate related to the direction of the optical axis, based on the second positional information stored in the memory for a period after the mask and the photosensitive substrate are carried to the exposure start position and before the exposure ends. Also, the first controller makes the memory store an amount of control of the second adjuster when controlling the second adjuster at the predetermined alignment point, while the third controller produces a correction map for representing appropriate correction values for the relative positional relation between the mask and the photosensitive substrate related to the direction of the optical axis at arbitrary positions, based on the discontinuous second positional information and the amount of control of the second adjuster stored in the memory so as to control the second adjuster in accordance with the correction map during exposure.

In the third aspect of the present invention as described above, the first controller makes the second adjuster adjust the relative positional relation between the mask and the photosensitive substrate related to the direction of the optical axis at the predetermined alignment point while monitoring an output of the second position detector when the mask and the photosensitive substrate are carried past a projection area of the projection optical system to the exposure start position and then makes the first detector detect the relative positional information between the mask and the photosensitive substrate in the two-dimensional direction perpendicular to the optical axis. (In this case, the relative positional relation between the mask and the photosensitive substrate means a separation between the mask and the photosensitive substrate related to the direction of the optical axis and a relative inclination of the mask and the photosensitive substrate with respect to the optical axis, and adjusting the positional relation between the mask and the photosensitive substrate related to the direction of the optical axis means adjusting both or either one of the position of at least one of the mask and the photosensitive substrate in the direction of the optical axis and an inclination of at least one of the mask and the photosensitive substrate with respect to the optical axis, i.e., a so-called focusing operation (focus correction). They have the same meaning also in the following description.) Pieces of the first and second positional information which are detected by the first and second controllers are successively stored in the memory.

When the mask and the photosensitive substrate are carried to the exposure start position, before the exposure starts, the second controller makes the first adjuster adjust the relative position between the mask and the photosensitive substrate in the two-dimensional direction perpendicular to the optical axis, at least based on the first positional information at the predetermined alignment point stored in the memory. Since an alignment between the mask and the photosensitive substrate is thereby performed, based on the first positional information measured in an in-focus state, if either "the scheme by image processing using image pick-up elements such as CCD", or "the scheme using laser beams or the like" is adopted as a scheme for the alignment method, errors in the measurement caused by focusing errors (from an out-of-focus state) or inclination errors of the illumination light flux can be prevented so as to obtain excellent alignment results.

Also, for a period after the mask and the photosensitive substrate are carried to the exposure start position until the exposure ends, the third controller makes the second adjuster adjust the relative positional relation between the mask and the photosensitive substrate related to the direction of the optical axis, based on the second positional information stored in the memory. In this case, the third controller may globally adjust the relative positional relation between the mask and the photosensitive substrate with respect to the direction of the optical axis, or may successively adjust the relative positional relation between the mask and the photosensitive substrate with respect to the direction of the optical axis during exposure.

Further, the first controller makes the second adjuster adjust the relative positional relation between the mask and the photosensitive substrate with respect to the direction of the optical axis at the predetermined alignment point while monitoring an output of the second position detector when the mask and the photosensitive substrate are carried past the projection area of the projection optical system to the exposure start position, and at the same time, makes the memory store the amount of control of the second adjuster. After that, the first controller makes the first detector detect the relative positional relation between the mask and the photosensitive substrate in the two-dimensional direction perpendicular to the optical axis. In this case, if there are a plurality of such alignment points, the above-mentioned operation of the first controller is conducted repeatedly for each of the alignment points. Pieces of the first and second positional information detected by the first and second position detectors are successively stored in the memory.

When the mask and the photosensitive substrate are carried to the exposure start position in this manner, the second controller makes the first adjuster adjust the relative positional relation between the mask and the photosensitive substrate in the two-dimensional direction perpendicular to the optical axis, at least based on the first positional information at the predetermined alignment points stored in the memory, before the exposure starts.

When the mask and the photosensitive substrate are carried to the exposure start position, the third controller produces a correction map for representing appropriate correction values of the relative positional relation between the mask and the photosensitive substrate with respect to the direction of the optical axis at arbitrary positions, based on the discontinuous second positional information and the amount of control of the second adjuster stored in the memory, and controls the second adjuster in accordance with the correction map during exposure. Thereby, the relative positional relation between the mask and the photosensitive substrate with respect to the direction of the optical axis is successively adjusted in accordance with the correction map.

According to the above-mentioned aspect of the present invention, even if at least one of the mask and the photosensitive substrate is moved to the direction of the optical axis together with the focusing control and the measurement reference immediately before is changed to make the measurement results to be discontinuous, the correction map with which the discontinuous measurement results are converted into continuous ones based on a single reference is produced before the start of the exposure, thereby preventing the focusing control accuracy during scanning exposure from degrading.

It is preferred that, in this respect, the second position detector for detecting the relational position between the mask and the photosensitive substrate in the direction of the optical axis is of a type which measures and stores the positions of the mask and the photosensitive substrate separately and calculates the results thereof by arithmetic operations to obtain a relative distance therebetween.

The above and other objects, features and advantages of the present invention are explained hereinafter and may be better understood by reference to the drawings and the descriptive matter which follows.

BRIEF DESCRIPTION OF THE DRAWINGS

FIG. 5 is a schematic block diagram to show another embodiment of the scanning exposure apparatus according to the present invention;

FIG. 13 is a schematic block diagram to show still another embodiment of the scanning exposure apparatus according to the present invention;

FIGS. 15A to 15E are drawings to illustrate an operation for producing the correction map by using the control system.

DETAILED DESCRIPTION OF THE PREFERRED EMBODIMENTS

Figure 3:
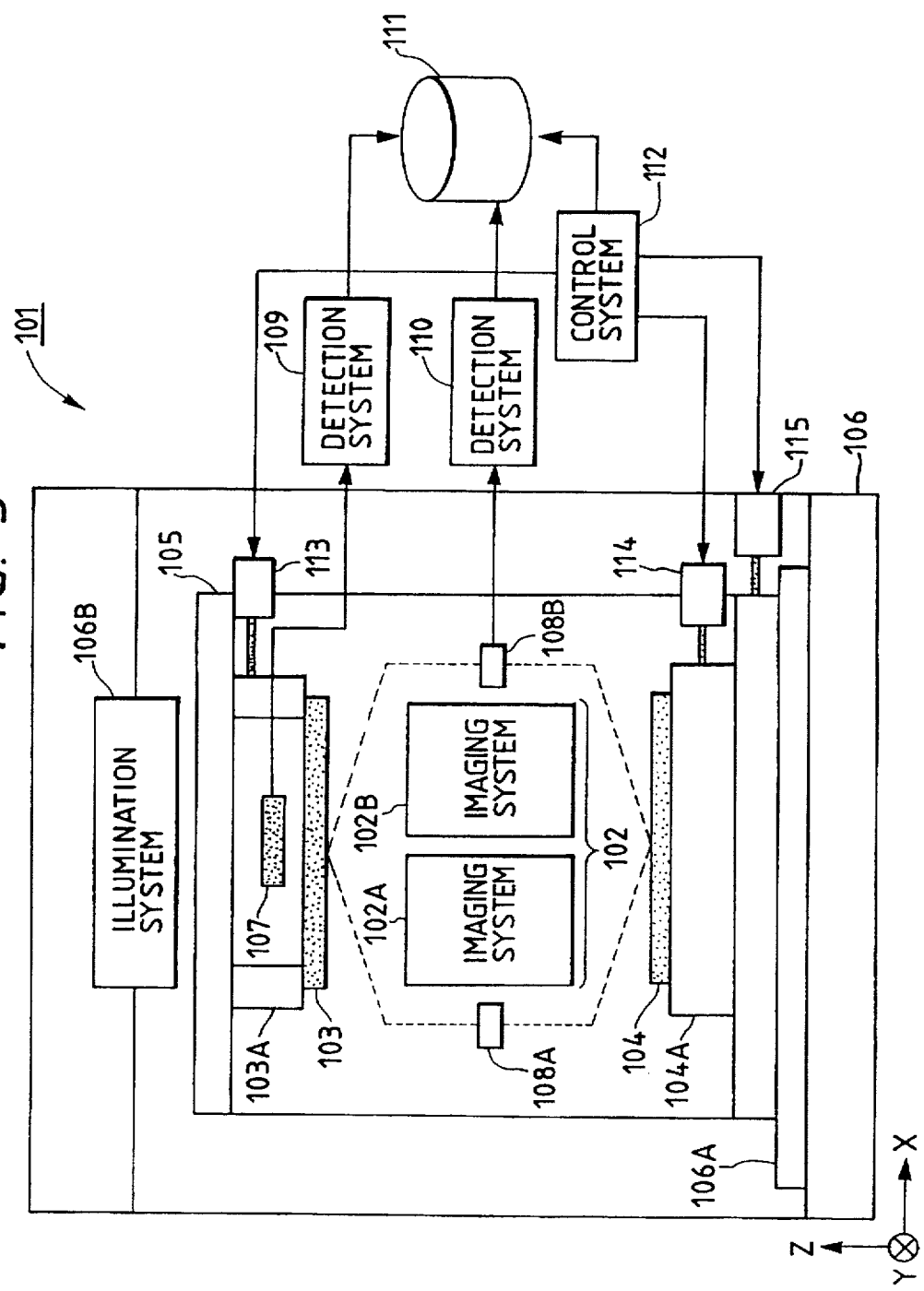
FIG. 3 is a schematic block diagram to show an embodiment of the scanning exposure apparatus according to the present invention.

Referring to FIG. 3 to show an embodiment of the scanning exposure apparatus according to the present invention, reference numeral 101 designates the scanning exposure apparatus as a whole. This scanning exposure apparatus 101 is one of a type to perform projection exposure of original patterns formed (or written) on the mask 103 to the photosensitive substrate 104 by synchronously moving, in a left-to-right direction (X direction) on the plane of the figure, the mask 103 and photosensitive substrate 104 as opposed to each other on either side of an imaging optical system 102 consisting of two imaging optic series (or projection optic series) 102A and 102B.

Here, each of the two imaging optic series 102A and 102B includes a plurality of imaging optical elements arranged in the Y direction in the drawing, and the plurality of imaging optical elements are arranged so that projected images thereby on the photosensitive substrate 104 are located in a zigzag manner and so that edge portions of adjacent images in different series overlap with each other in the Y direction. In other words, edge regions in the regions projected by the two imaging optic series 102A and 102B are subjected to overlap exposure at a fixed time difference, whereby a large area can be exposed in the Y direction by single scan as a result.

Incidentally, in the case of this scanning exposure apparatus 101, a carrying system (not shown) for carrying the mask 103 and the photosensitive substrate 104 to respective holders 103A and 104A is not set on the both sides of the imaging optical system 102, but is only on one side thereof. This means that after completion of exposure with the mask and photosensitive substrate being mounted on the respective holders, they must be moved again to the position of the carrying system in order to change the photosensitive substrate and the mask with next ones. Then, during a period when the scanning exposure apparatus 101 is moved from the position of the carrying system located off the imaging optical system 102 past the position of imaging optical system 102 (projection area) to an exposure start position (that is, during a period of go scan), a relation of relative position between the mask 103 and the photosensitive substrate 104 is measured, and then the mask 103 and the photosensitive substrate 104 are moved backward (that is, return scan is performed) while correcting the relation of relative position, based on the result of the measurement, whereby the patterns formed on the mask 103 are projected to the photosensitive substrate 104 to effect exposure thereon.

As described, the scanning exposure apparatus 101 as described in the present embodiment has the detection period of the relation of relative position during the go scan, which is an essential scan period, and is arranged to detect the relation of relative position between the mask 103 and the photosensitive substrate 104 during this period, whereby it can follow a steep change of flatness in the mask 103 and the photosensitive substrate 104 without a decrease of throughput.

Next described are elements in the scanning exposure apparatus 101 that can realize such exposure.

First describing the mask 103 and the photosensitive substrate 104, the mask 103 and photosensitive substrate 104 are fixed to a scan stage 105 of a C-shaped cross section through the respective holders 103A and 104A. This scan stage 105 is mounted on a main body 106 so as to be movable along rails 106A, and is arranged so that synchronous movement of mask 103 and photosensitive substrate 104 is achieved by movement of the scan stage 105.

An illumination optical system 106B is retained by the main body 106 and is arranged to illuminate the original patterns formed (or written) on the mask 103 with illumination light emitted from the illumination optical system 106B.

Further, there are two detection optical systems prepared for accurately positioning the mask 103 and the photosensitive substrate 104 in the scanning exposure apparatus 101.

One of them is an alignment sensor 107 used in measuring a relative position between the mask 103 and the photosensitive substrate 104, and the other is a plurality of focus sensors 108 used for measurement of a relative distance (or a height measured not through the imaging optical system 102) between the mask 103 and the photosensitive substrate 104. Incidentally, the relative distance between the mask 103 and the photosensitive substrate 104 is a separation therebetween along the optical axis of imaging optical system 102.

Here, the alignment sensor 107 is fixed together with the imaging optical system 102 to the main body 106, and is arranged to measure marks for measurement of relative position (hereinafter referred to as alignment marks) located at arbitrary positions in the running direction (X direction) of mask 103 and photosensitive substrate 104. In this connection a main component of the alignment sensor 107 in this embodiment is a CCD camera, which is arranged to measure positional deviation between alignment marks formed on the mask 103 and the photosensitive substrate 104, based on signal processing of an image plane picked up thereby.

Meanwhile, each focus sensor 108 is composed of two optical elements, i.e., a light-emitting device 108A and a light-sensing device 108B. In this embodiment, there are a plurality of focus sensors 108 arranged along a direction perpendicular to the running direction (or in the Y-axis direction). Also, these plural focus sensors 108 are arranged so that a straight line connecting detecting points by the focus sensors 108 falls between two straight lines connecting projected regions by the associated imaging optic series 102A and 102B.

Each focus sensor 108 is arranged so that illumination light emitted in a slit configuration from the light-emitting device 108A is guided to impinge on the surfaces of mask 103 and photosensitive substrate 104 and slit images focused on the respective surfaces are re-imaged on the light-sensing device 108B to measure a relative distance between the two images, thereby in turn measuring a relative distance between the mask 103 and photosensitive substrate 104.

These two detection optical systems (alignment sensor 107 and focus sensors 108) are arranged to send measurement results S1 and S2 through detection systems 109 and 110 corresponding to the respective detection optical systems, to a memory device 111. In this connection the memory device 111 is provided with a memory medium such as a fixed disk, thereby storing positional information at measuring points by the alignment sensor 107 and focus sensors 108.

Here, the memory device 111 is arranged to store the detection results S1, S2 obtained at the respective measuring points. Particularly, flatness maps indicating the flatnesses of the surfaces of mask 103 and photosensitive substrate 104 are produced based on the detection results S2 in the axial direction, and the memory device 111 is arranged to store it.

A control system 112 is prepared as a control means for finely adjusting the holders 103A and 104A and the scan stage 105, based on the positional information stored in the memory device 111. The control system 112 controls drive systems 113, 114, and 115, based on the positional information read out from the memory device 111, so as to correct positions of the holders 103A and 104A and the scan stage 105. Namely, alignment can be corrected by moving the holders 103A and 104A in XY directions, and focus (a position in the direction along the optical axis of the imaging optical system 102) or leveling (inclination relative to the optical axis of the imaging optical system 102) can be corrected by moving them in the Z direction.

Next described using FIGS. 4A to 4E is an example of a sequential scanning exposure operation by the scanning exposure apparatus 101 arranged in the above structure.

Figure 4A:
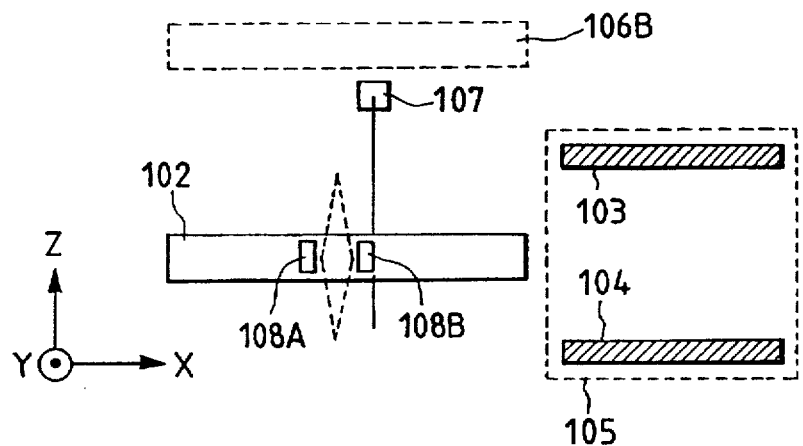
FIG. 4A to FIG. 4E are schematic drawings to illustrate scanning exposure.

At initial setting the scan stage 105 is first stopped at a position off the imaging optical system 102, as shown in FIG. 4A. The scanning exposure apparatus 101 receives the mask 103 and photosensitive substrate 104 from the carrying system to mount them on the holders 103A and 104A on the scan stage 105 stopped at this position, and then starts carrying them to the exposure start position.

Figure 4B:
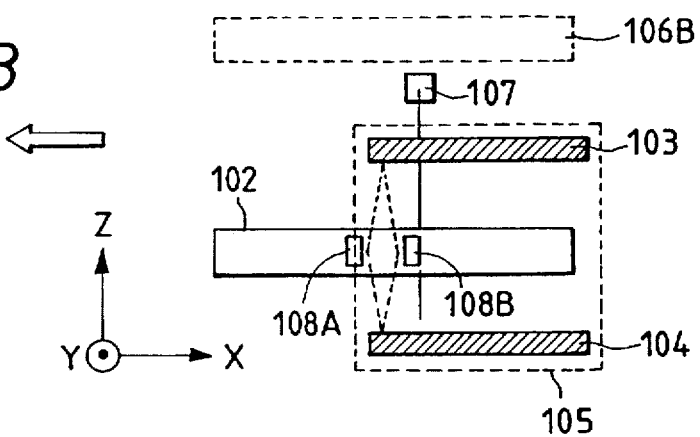
Figure 4C:
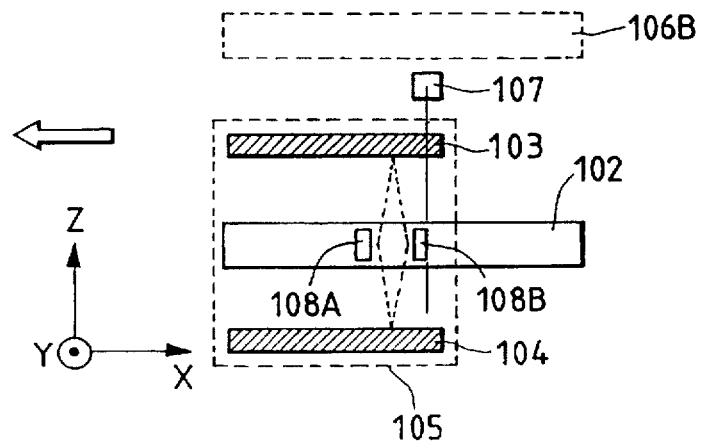

The carrying direction this time is the direction shown by the arrow in FIGS. 4B and 4C. This movement of the scan stage 105 effects synchronous movement of the mask 103 and photosensitive substrate 104. During this go scan, the control system 112 successively measures the separation along the optical axis between the mask 103 and the photosensitive substrate 104 at constant measuring intervals or positions in the running direction, which are preliminarily set in the memory device 111. The control system temporarily stops the scan stage 105 at each of positions of an arbitrary number of alignment marks which are preliminarily set similarly in the memory medium, so as to measure relative positional deviation between the mask 103 and the photosensitive substrate 104 at each position.

Figure 4D:
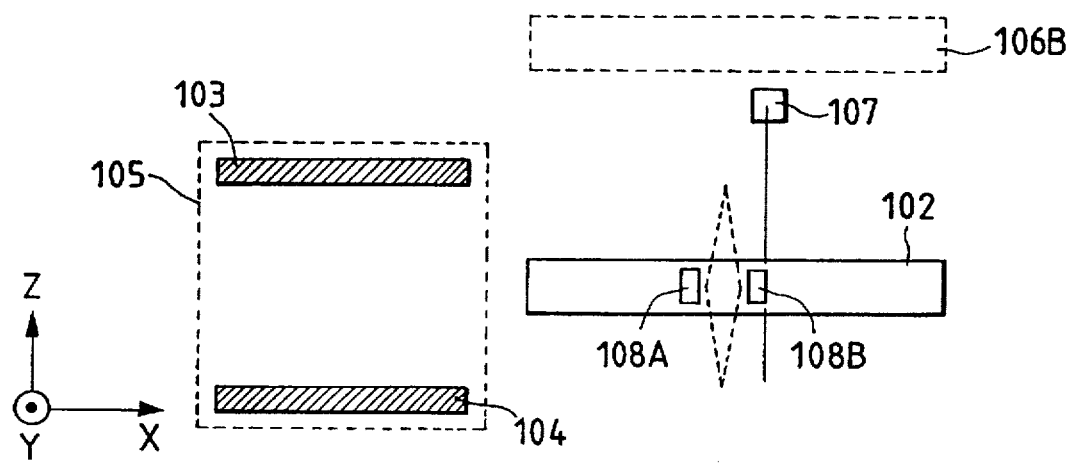

After completion of the measurements of the positions of alignment marks and the separations along the optical axis, the scan stage 105 is stopped at a position where the mask 103 and the photosensitive substrate 104 are completely away from the imaging optical system 102, as shown in FIG. 4D, in order to start exposure of mask patterns to the photosensitive substrate 104 by backward scan (that is, return scan).

On this occasion, the control system 112 derives elements of shift, rotation, magnification, orthogonality (inclination of the axis perpendicular to the scan direction), etc. by a technique using the method of least squares from amounts of relative positional deviation between the mask 103 and the photosensitive substrate 104 as obtained by the measurements of the plurality of alignment marks, and, based thereon, supplies a control signal to the drive system 113 to correct the setting position of holder 103A, thereby correcting the positional deviation of the mask 103 relative to the photosensitive substrate 104.

On this occasion the control system 112 also corrects the magnification and orthogonality through a magnification adjusting mechanism (not shown) provided in the imaging optical system 102 and through an image shifter mechanism (not shown) for adjusting a transfer position of a transferred image.

Further, the control system 112 this time produces a flatness map of the mask 103 and a flatness map of the photosensitive substrate 104, based on the measurement results of the plurality of focus sensors 108.

Incidentally, the individual imaging systems constituting the imaging optical system 102 each have a focus height and range (depth of focus) for achieving a best resolving power, and therefore, the control system 112 produces such an approximate plane, as a reference surface to the mask 103, that both the mask 103 and the photosensitive substrate 104 are set within the depth of focus, taking those into consideration. The control system derives by the method of least squares the focus height of the photosensitive substrate 104 (or the mask 103) and an inclination of a surface of a region including all projection areas of the plurality of imaging systems. The control system 112 controls the drive system 114 so that the inclination of photosensitive substrate 104 coincides with that of the approximate plane at this stage, so as to correct the mount positions of mask 103 and photosensitive substrate 104.

Figure 4E:
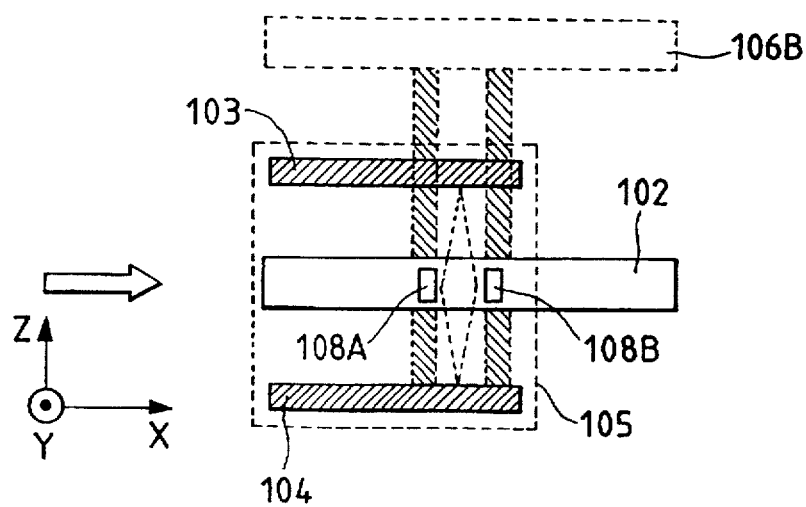

When the control is finished for the correction of mount position of mask 103 and for the separation and inclination in the direction of the optical axis, based on the flatness maps in the described manner, the control system 112 starts moving the scan stage 105 in the direction represented by the arrow as shown in FIG. 4E, thereby effecting successive projection exposure of images of the patterns formed on the mask 103 to the photosensitive substrate 104.

By the way, because the present embodiment is so arranged that the relation of relative position between the mask 103 and the photosensitive substrate 104 is already corrected in the best condition by the previously described correction processing, there is no possibility of imaging errors or the like due to exposure scanning.

Also in this case, the scan speed can be increased during exposure because of no need of complex arithmetic processing during the scanning period, whereby the exposure operation can be completed within a much shorter time as compared with those heretofore.

After completion of movement of the scan stage 105 up to the position of the carrying system, the control system 112 stops the scan stage 105 to interchange the mask 103 and photosensitive substrate 104 currently set in the holders 103A and 104A with new mask 103 and photosensitive substrate 104 for next exposure. The above operation is a cycle of exposure operation.

The above structure is so arranged that during the go scan for carrying the photosensitive substrate 104 received from the carrying system past the position of the imaging optical system 102 to the opposite side thereof to the carrying system, the alignment sensor 107 measures the relative position between the mask 103 and the photosensitive substrate 104 and the focus sensors 108 measure the distance in the direction of the optical axis between the mask 103 and the photosensitive substrate 104, whereby the relation of relative position between the mask 103 and the photosensitive substrate 104 is corrected before scanning exposure based on these information, which can increase the scanning speed during the return scan and which can improve the throughput remarkably as compared with those heretofore.

Particularly, in the case of the method for performing the measurement and correction of the relative positional relation during exposure as heretofore, a CPU with high processing capability was needed because measurement data obtained must be subjected to complex statistical processing as represented for example by the method of least squares. In contrast, the present embodiment does not need to use such a CPU, thus being economical.

In addition, because the various factors necessary for correcting the relative positional relation between the mask 103 and the photosensitive substrate 104 are obtained before the exposure operation, occurrence of imaging errors etc. can be effectively prevented in exposure using the mask 103 and photosensitive substrate 104 which could include a steep change, unpredictable with the method for performing simultaneous measurement and correction.

The above-described embodiment was an example in which preliminary correction was carried out at the exposure start position, which is the end point of the go scan, in such a manner that the photosensitive substrate 104 was located at the approximate plane obtained to the reference plane of mask 103, but it is noted that the present invention is not intended to be limited to it; for example, the position of the photosensitive substrate 104 may be arranged to be successively corrected during the return scan as in the embodiment as detailed later. In that case, a possible arrangement is such that a control map for correction (indicating correction values at arbitrary positions on the photosensitive substrate) is preliminarily produced with a flatness map (described later) as a reference while the scan stage 105 is stopped at the exposure start position and that after start of scanning, the separation along the optical axis and/or an angle of inclination relative to the optical axis is successively corrected based on the control map. In this connection the angle of inclination may be corrected in the direction along the scan direction or in the direction perpendicular to the scan direction. Additionally using measurement values of the focus sensors 108 obtained during exposure in real time, the control according to the control map thereof can be performed on a more certain basis.

Even in the case where the position of photosensitive substrate 104 is corrected during scanning exposure as described, the photosensitive substrate 104 can be controlled so as to be always located at an appropriate position relative to the mask 103 because the positional information concerning the exposure region is obtained prior thereto and control amounts for correction have already been calculated. This permits exposure without imaging errors.

Also in this case, if the responsivity is not good enough of the drive system for controlling the position along the optical axis and the inclination of the photosensitive substrate 104 or if the drive system cannot follow a change of flatness of the mask and/or the photosensitive substrate, an additional mechanism may be provided for decreasing the scan speed a little or for controlling the illuminance of illumination light beam to lower the illuminance. The throughput can be increased in this manner as compared with those heretofore, and exposure can be made without a possibility of degradation of resolution.

Further, the correction during scanning exposure was described with an example in which the height of photosensitive substrate 104 etc. was successively corrected while keeping the position of mask 103 fixed, but the invention can be widely applied to cases where the mask 103 is corrected while keeping the photosensitive substrate 104 fixed or cases where the mask 103 and photosensitive substrate 104 are simultaneously corrected. In such cases exposure can also be made without a possibility of degradation of resolution.

The above-described embodiment was an example in which the invention was applied to the scanning exposure apparatus using two imaging optic series, but the present invention is by no means limited to it; for example, the invention can be applied to cases of scanning exposure apparatus using a single imaging optical system or a series of imaging optical systems or cases of scanning exposure apparatus using three or more series of imaging optical systems. In either case scanning exposure can be achieved with higher throughput and with less degradation of resolution as compared with those heretofore.

Further, the above-described embodiment showed an example in which the alignment sensor 107 consisted of the CCD camera and the scan stage 105 was once stopped upon alignment in order to take in an image of alignment marks through the CCD camera, but the present invention is by no means limited to it; employing the laser interferometric alignment method, the scan stage 105 does not have to be stopped every alignment measurement. This can remarkably improve the throughput.

Although the above-described embodiment did not include any particular limitation as to the measurement points of positional information in the direction of the optical axis, the present invention is not limited to it; the positional information may be obtained by simultaneous measurement at the positions where the alignment marks are measured by the alignment sensor 107. This arrangement can further enhance the throughput.

Moreover, the above-described embodiment showed an example in which the positional information along the optical axis was taken without intervention of the imaging optic series 102A and 102B, that is, a case where the measurement position was located near the exposure region, but the present invention is not limited to it; the invention can be applied to cases where the position is measured in the direction along the optical axis through the imaging optic series 102A and 102B or where the measurement position is located within the exposure region. In such cases the correction accuracy can be further enhanced because the positional information in the exposure region can be attained as actually measured values.

The above-described embodiment did not touch a mutual relation between the mount positions of focus sensors 108 and the mount position of the alignment sensor 107, but by locating the focus sensors 108 on the upstream side (on this side) in the direction upon the go scan with respect to the alignment sensor 107, accurate focus can be effected at a position of alignment mark without decreasing the throughput, thereby further enhancing the alignment accuracy.

Another embodiment of the present invention will be detailed referring to FIG. 5 to FIG. 10.

There are three conceivable ways to control the separation between the mask 202 and the photosensitive substrate 203, as described previously: a method for driving the photosensitive substrate 203 while keeping the mask 202 stationary; a method for driving the mask 202 while keeping the photosensitive substrate 203 stationary; and a method for driving both the mask 202 and the photosensitive substrate 203. This embodiment illustrates a scanning exposure apparatus with a plurality of projection optical systems, using an example in which the photosensitive substrate 203 is driven while keeping the mask 202 stationary.

The schematic structure of the scanning exposure apparatus is shown in FIG. 5. The scanning exposure apparatus 211 is of a method of projection exposure for projecting patterns formed (or written) on the mask 202 to the photosensitive substrate 203 by synchronously moving in the direction (X direction) perpendicular to the plane of the drawing, the mask 202 and photosensitive substrate 203 as opposed to each other on either side of three projection optical systems 212A, 212B, and 212C.

The three imaging optical systems 212A, 212B, and 212C are arranged in a zigzag manner in the Y direction shown in the drawing so that projection regions thereof are partly overlapped in the Y direction between adjacent regions, and the mutual overlap between the edge portions of the respective exposure regions allows exposure to be effected in a large area by single scan.

The structure of each component is next described. The mask 202 and photosensitive substrate 203 are mounted through respective holders 213 and 214 to a scan stage 215 of a C-shaped cross section. It is noted herein that in practical application of the apparatus it is used in such a state that an opening portion of scan stage 215 faces up. The scan stage 215 is mounted to a main body 216 so that it can move in the X direction along rails 216A. This movement of the scan stage 215 realizes synchronous movement of mask 202 and photosensitive substrate 203. By the way, an illumination optical system 216B for illuminating the mask 202 and photosensitive substrate 203 to be synchronously moved is held on the main body 216.

Incidentally, the scanning exposure apparatus 211 is provided with two detection optical systems for accurately adjusting a positional relation between the mask 202 and the photosensitive substrate 203. One of them is an alignment sensor (not shown) used in measuring a relative position between the mask 202 and the photosensitive substrate 203. The other of them is a plurality of focus sensors 217 used in measuring a relative separation between the mask 202 and the photosensitive substrate 203. In this connection, because the relative separation between the mask 202 and the photosensitive substrate 203 indicates the direction of focal points of projection optical systems 212A, 212B, and 212C, it will be called as the focus direction (Z direction in the drawing) hereinafter.

Each focus sensor 217 is composed of two optical elements, i.e., a light-emitting device 217A and a light-sensing device 217B. The pair of these light-emitting device 217A and light-sensing device 217B are set at off-axis positions in members of projection optical system. Upon measurement illumination light is emitted from the light-emitting device 217A toward each of the mask surface 202A and the photosensitive substrate surface 203A and a relative distance between images obtained from reflected light from the respective surfaces is measured so as to obtain a relative separation between the mask surface 202A and the photosensitive substrate surface 203A. It is assumed here in this embodiment that the relative separation is measured at a plurality of points on the mask surface 202A and the photosensitive substrate surface 203A. The more the measuring points, the higher the accuracy of flatness map as detailed later, but too many measuring points would result in consuming an excessive time for signal processing; so, an appropriate number of measuring points is to be selected.

Figure 6A:
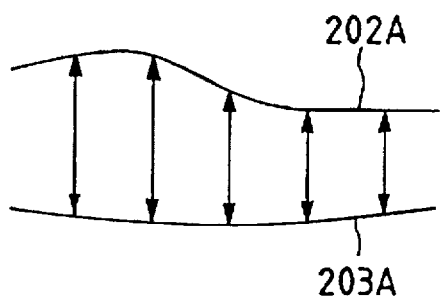
FIG. 6A and FIG. 6B are schematic drawings to illustrate an arrangement in which asperities present in both the mask surface and the photosensitive substrate are assumed to be those only in the photosensitive substrate.

Detection results S21 measured at the respective measuring points by the focus sensor 217 are supplied through a detection system 218 to a memory device 219 and are stored as positional information in a memory medium such as a fixed disk. Incidentally, measured values given from the detection system 218 are just relative separations between the mask 202 and the photosensitive substrate 203, and therefore, it cannot be distinguished which of the mask 202 or the photosensitive substrate 203 has asperities, as shown in FIG. 6A.

Figure 6B:
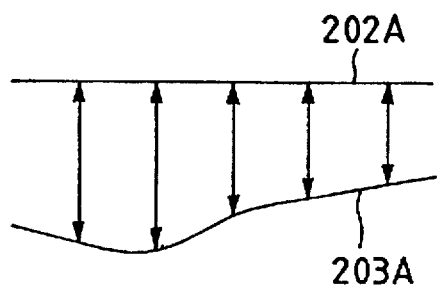

Then the present embodiment assumes that the mask 202 is an ideal plane and all asperities are present in the plate 203, as shown in FIG. 6B. Namely, the height or inclination of the photosensitive substrate 203 is controlled based on the measured values with the mask surface 202A as a reference. For this, the memory device 219 produces a curved surface with asperities on the photosensitive substrate surface 203A being connected with contour lines based on the detection results S21 supplied from the detection system 218 (hereinafter will be referred to as a flatness map), and stores it.

The control system 220 controls drive systems 221, 222, and 223, based on the flatness map so as to correct positions of the holders 213 and 214 and the scan stage 215. If the photosensitive substrate 203 in the exposure region is controlled along the flatness map in this manner, the separation between the mask 202 and the photosensitive substrate 203 can be always optimized. However, the photosensitive substrate 203 cannot be moved for every one of the individual exposure regions corresponding to the projection optical systems 212A to 212C.

Figure 7:
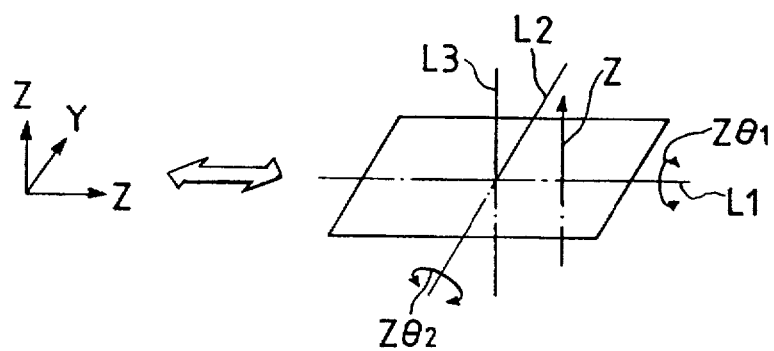
FIG. 7 is a schematic drawing to illustrate drive axes used in correction of positional relation.

Then the scanning exposure apparatus 211 produces an approximate plane as a plane that can optimize the separation between the mask 202 and the photosensitive substrate 203 in the exposure regions and that can be controlled by movement or rotation in directions of Z, $Z\theta_1$, and $Z\theta_2$ as described below. Then, as shown in FIG. 7, the photosensitive substrate 203 is controlled to coincide with the approximate plane by rotating it in the rotational direction $Z\theta_1$ about a center axis L1 being the scan direction (X direction) or rotating it in the rotational direction $Z\theta_2$ about a center axis L2 being a direction (Y direction) perpendicular to the scan direction (X direction) and focus direction (Z direction). (Here, the drive in $Z\theta_2$ is made in cases where two series of projection optical systems are aligned in the scan direction.)

Figure 8:
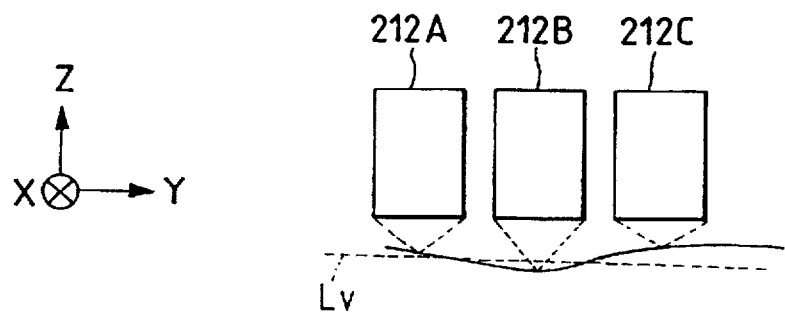
FIG. 8 is a schematic drawing to illustrate an approximate plane.

There are a variety of production methods of the approximate plane. First considered is a simple method using the method of least squares. When this method is employed, flatness is obtained at a plurality of points aligned in the direction (Y direction) perpendicular to the scan direction (X direction) in the photosensitive substrate surface 203A and an approximate line LV is produced with a plurality of flatness values by the method of least squares. This approximate line LV is shown in FIG. 8. Upon exposure the holder 214 is rotated (in $Z\theta_1$) or moved (in the Z direction) so as to make the photosensitive substrate surface 203A coincident with the approximate line LV obtained for positions on a scan line.

Incidentally, the scanning exposure apparatus 211 has the three projection optical systems 212A, 212B, and 212C. There is thus a possibility that the photosensitive substrate cannot be located at a best position because of differences of focal lengths of the respective projection optical systems 212A, 212B, and 212C if the mask 202 and the photosensitive substrate 203 are simply adjusted to match with the approximate plane. Thus, the flatness map is produced taking account of the differences of focal lengths of the respective projection optical systems 212A, 212B, and 212C.

Figure 9:
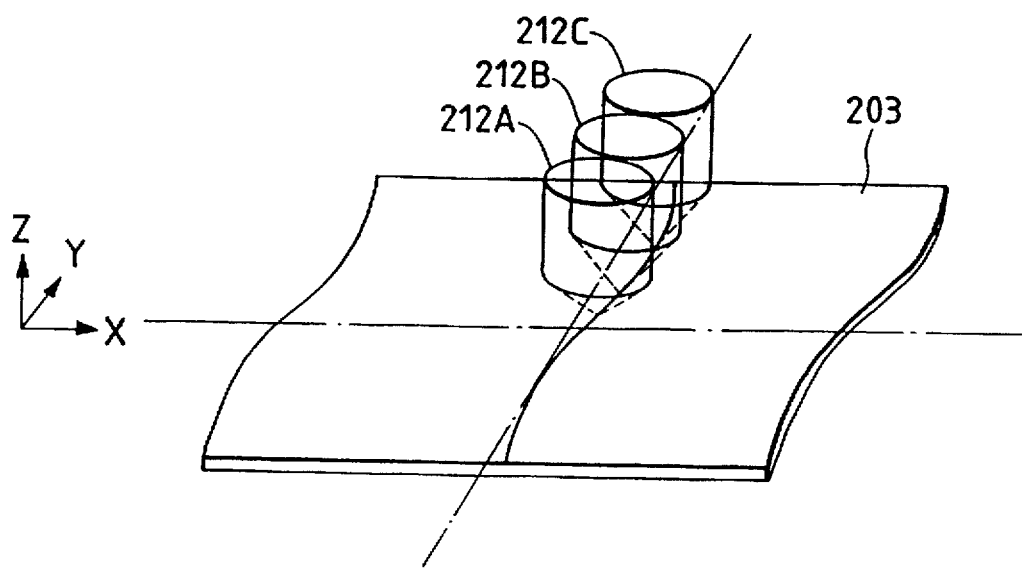
FIG. 9 is a schematic, perspective view to show a trace of focal point positions as obtained by scanning exposure using projection optical systems with different focal lengths.

For example, if scanning exposure is done with the differences of focal lengths of the plural projection optical systems 212A, 212B, and 212C aligned in the Y direction, it can be said as if there is winding in the Y direction of photosensitive substrate 203, as shown in FIG. 9. In other words, the differences of focal lengths can be considered as asperities of photosensitive substrate 203. In this case the differences can be overcome by rotating (in $Z\theta_1$) the photosensitive substrate 203 about the center axis L1 parallel to the scan direction (X direction) during scanning exposure.

In this manner, the scanning exposure apparatus 211 is arranged so that the patterns on the mask 202 can be accurately transferred to the photosensitive substrate 203 for each of the exposure regions illuminated through the projection optical systems 212A, 212B, and 212C by correcting the positional relation between the mask 202 and the photosensitive substrate 203, based on the information about the approximate plane obtained for the separation between the mask 202 and the photosensitive substrate 203, and the information about the focal lengths.

The scanning exposure operation by the scanning exposure apparatus 211 is next described in the above structure.

First, prior to exposure, the scanning exposure apparatus 211 measures the relative separation between the mask 202 and the photosensitive substrate 203 at arbitrary points on the mask 202 and photosensitive substrate 203, and stores the positions and relative relations in the memory medium in the memory device 219. Also, the scanning exposure apparatus produces the flatness map as described above, based on this information, to produce the approximate plane. In addition, the apparatus also obtains correction amounts based on the differences of focal lengths of the respective projection optical systems 212A, 212B, and 212C.

When necessary information is obtained by these processings, the control system 220 supplies control data to the drive system 223 to start moving the scan stage 215. Also, the control system 220 supplies control data to the drive system 222 to move the holder 214 with the photosensitive substrate 203 mounted thereon in the Z direction or to rotate it (in $Z\theta_1$ and $Z\theta_2$) about the two center axes L1, L2 (wherein it is driven in $Z\theta_2$ if two series of projection optical systems are aligned in the scan direction; this is the case in the following description), whereby the positions of photosensitive substrate 203 and mask 202 are controlled in a best condition during scanning exposure.

The apparatus is thus arranged so that the control data about the photosensitive substrate 203 is sent from the control system 220 to the drive system 222 and so that the photosensitive substrate 203 is driven based on the data value, but processing would be too late if the control data about a region to be exposed were sent from the control system 220 to the drive system 222 at the time of transmission of control data. In other words, the photosensitive substrate 203 runs in a period before the drive system 222 starts the operation based on the control data, so that when the control for position control is actually carried out, the drive of photosensitive substrate 203 is executed for a position that lags a position designated by the control system 220.

Then, the control system 220 is arranged to send the control data at a position a little before the controlled position so as to complete the drive for holder 214 at the designated position, taking account of the running speed of the photosensitive substrate 203 (or the scan speed of the scan stage 215).

For example, when t1 represents a time for the positional information to be sent as control data from the control system 220 to the drive system 222, t2 a time for the drive system 222 to judge the positional information and to complete the drive, and v a moving speed of the photosensitive substrate 203 at the moment, and if the position of photosensitive substrate 203 is desired to be corrected when a certain exposure region comes to a position x, the positional information is to be sent when the exposure region comes to a position X represented by the following equation.

$$X = x - v(t1+t2) \quad (1)$$

As described, the scanning exposure apparatus 211 performs scanning exposure while moving the photosensitive substrate 203 in the Z direction or rotating it (in $Z\theta_1$ and $Z\theta_2$) about the two center axes L1, L2, based on the control data, with necessity (where in the drive in $Z\theta_2$ is executed where two series of projection optical systems are aligned in the scan direction).

According to the above structure, the positional relation between the mask 202 and the photosensitive substrate 203 during scanning exposure is always controlled in an optimum state (where the resolution and telecentricity are best), based on the information about the relative separations and the positions preliminarily measured and stored, whereby the patterns on the mask 202 can be transferred in an accurate condition to the photosensitive substrate 203.

Further, a fine control matching with the configuration of mask surface 202A or photosensitive substrate 203A can be realized by the arrangement that the apparatus is arranged to correct not only the position of photosensitive substrate 203 along the optical axis (Z direction), but also the inclination of photosensitive substrate 203 by rotating it about the center axis L1 parallel to the scan direction (X direction) or about the center axis L2 perpendicular to the scan direction.

The above-described embodiment was described as an example in which for correcting the relative positional relation between the mask 202 and the photosensitive substrate 203, only the photosensitive substrate 203 was successively driven during scanning exposure while keeping the mask 202 stationary, but the present invention is not limited to it; only the mask 202 may be arranged to be successively driven during scanning exposure while keeping the photosensitive substrate 203 stationary; or both the mask 202 and the photosensitive substrate 203 may be arranged to be successively driven during scanning exposure.

Also, the above-described embodiment showed an example using the three projection optical systems, but the present invention is not limited to it; the invention can be widely applied to cases using two projection optical systems or using four or more systems.

Further, the above-described embodiment showed an example in which the projection optical systems 212A to 212C are aligned along the direction (Y direction) perpendicular to the scan direction (X direction) and the direction of the optical axes of the projection optical systems (Z direction), but the present invention is by no means limited to it; the invention can be applied to cases where a plurality of series of the projection optical system groups each aligned in the Y direction are arranged in the scan direction (X direction).

Figure 10:
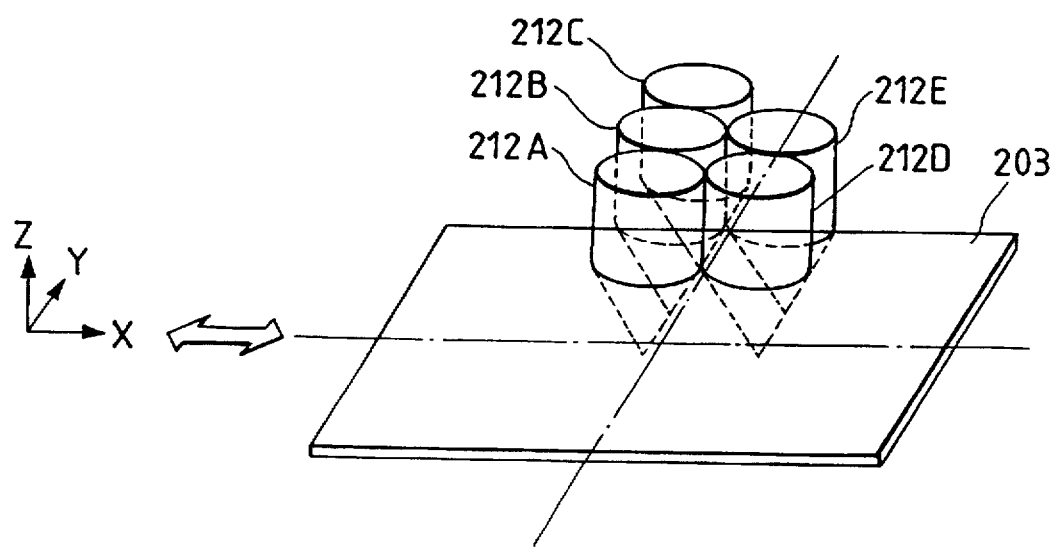
FIG. 10 is a schematic, perspective view to illustrate a plurality of series of projection optical systems arranged in the scanning direction.
Figure 11A:
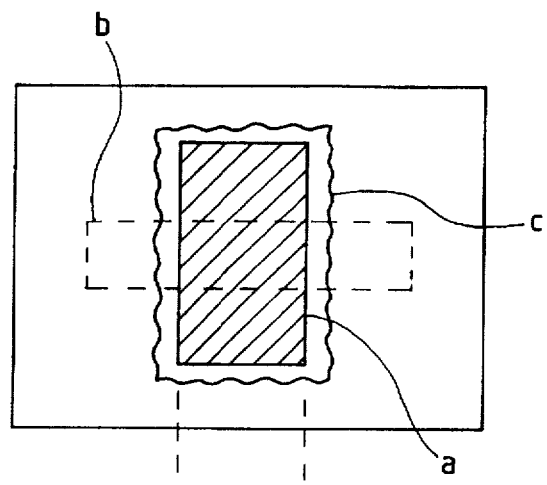
FIGS. 11A to 11C are drawings to illustrate a problem to be solved by the present invention in which an influence of an out-of-focus state on the alignment measurement is visually explained.
Figure 11B:
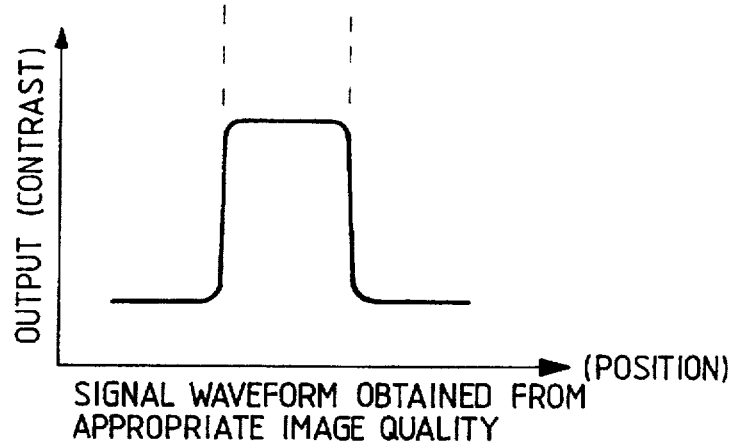
Figure 11C:
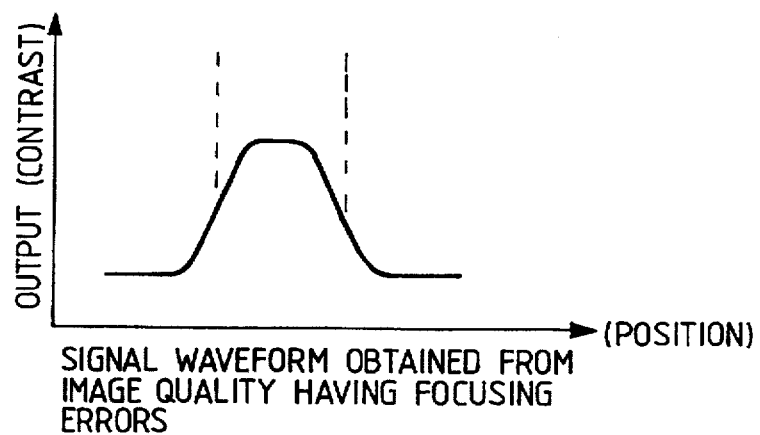
Figure 12:
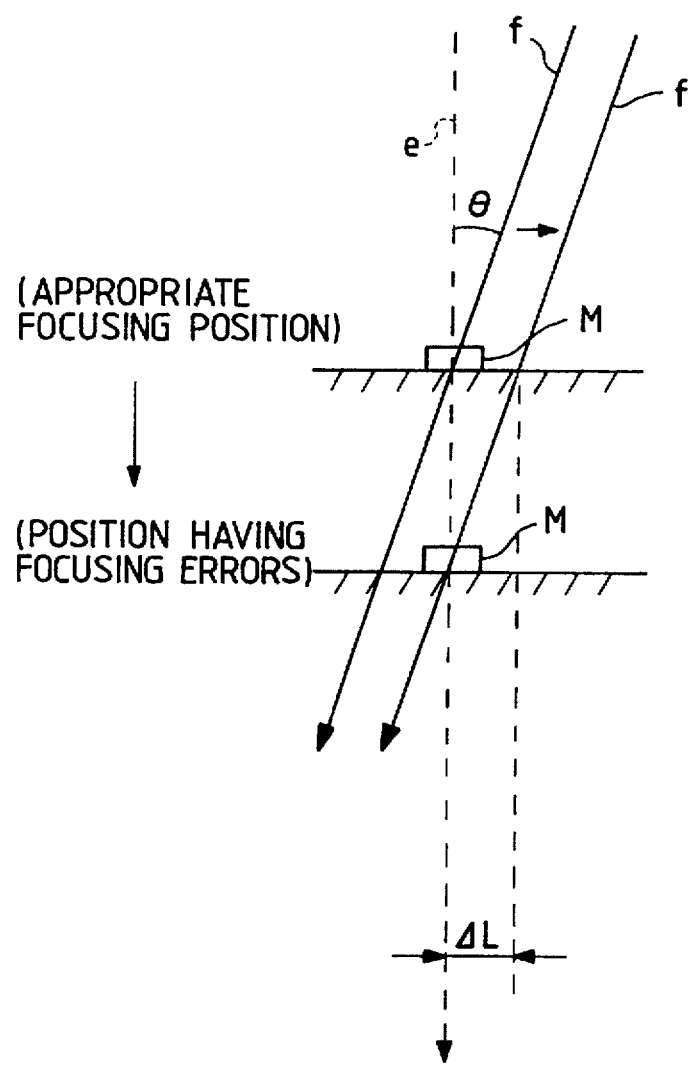
FIG. 12 is a drawing to illustrate a problem to be solved by the present invention in which an influence of inclination errors of the illumination light flux relative to the optical axis on the alignment measurement is visually explained.

For example, plural projection optical systems may be arranged in two columns along the scan direction as shown in FIG. 10. In this case, if there is a difference of focal length between the first column of projection optical systems 212A to 212C and the second column of projection optical systems 212D and 212E and if scanning exposure is carried out as it is, a difference due to the difference of focal length would appear between exposure patterns in the first column and exposure patterns in the second column. Then, in that case, the difference may be overcome by rotating the mask 202 or the photosensitive substrate 203 (in $Z\theta_2$) about the center axis L2 perpendicular to the scan direction (X direction). Namely, the difference may be overcome by moving the mask 202 or photosensitive substrate 203 in the Z direction or rotating the mask 202 or photosensitive substrate 203 (in $Z\theta_1$ or $Z\theta_2$) about the two axes L1, L2 so as to make it coincident with the approximate plane. This can reduce the pattern difference due to the difference of focal length.

Further, the above-described embodiment illustrated a case which used the method of least squares in producing the approximate plane, but the present invention is not limited to it; the approximate plane may be produced using another method. For example, a method for taking the maximum value of flatness into consideration may be considered. In the method employing the method of least squares, if there is a fine maximum or minimum, a difference from the approximate plane becomes great at the outstanding portion, because the average plane is obtained for the entire area. On the other hand, existence of a local peak would result in exposure variations during exposure even if it is fine. Thus, a plane gently connecting the maximum value with the minimum value would be preferred rather than the average plane of the entire exposure region.

Another method may be one taking the depth of focus into consideration. An optical system has a depth of focus, within the range of which the system is kept in focus. In other words, even if there are asperities in the mask 202 and/or the photosensitive substrate 203, or even if there is a difference of focal length between the plural projection optical systems 212A to 212C, the mask 202 or photosensitive substrate 203 does not have to be driven as long as they are kept within this range. It is thus conceivable that the depth of focus is preliminarily measured and the plate is driven into the range.

It is considered that when a plurality of flatness values are obtained in the direction (Y direction) perpendicular to the scan direction (X direction) and the focus direction (Z direction), an extremely different value could be shown as the flatness. Conceivable reasons thereof are partial deformation of plate, deposition of dust, abnormality of detector, etc. In this case, if such information is used as it is, an accurate, approximate plane cannot be attained because the use of abnormal value affects other flatness values. To avoid such inconvenience, a permissible value may be set and flatness values exceeding the permissible value are omitted.

The above-described embodiment showed an example in which the flatness map of photosensitive substrate 203 was produced with respect to the reference of mask 202 from the relative separations between the mask 202 and the photosensitive substrate 203, but the present invention is by no means limited to it; the invention can be applied to cases for producing the flatness map of mask 202 with respect to the reference of photosensitive substrate 203 or cases for obtaining flatness maps for the mask 202 and photosensitive substrate 203. Obtaining the flatness maps of mask 202 and photosensitive substrate 203, the same control as above can be applied because the relative separation between the mask 202 and the photosensitive substrate 203 can be known.

Further, the above-described embodiment showed an example where the mask 202 and photosensitive substrate 203 were arranged to rotate about the center axes L1 and L2, but the present invention is not limited to it; the mask 202 and the photosensitive substrate 203 may be arranged to move in the X-Y plane (or for the center axes L1 and L2 each to move in the X-Y plane).

Still another embodiment of the present invention will be described below with reference to FIGS. 13 to 15E.

FIG. 13 schematically shows the structure of the scanning exposure apparatus 301 according to the present embodiment. This scanning exposure apparatus 301 is one of a type to perform projection exposure of original patterns formed (or written) on the mask 303 to the photosensitive substrate 304 by synchronously scanning, in a left-to-right direction (X direction) on the plane of the figure, the mask 303 and the photosensitive substrate 304 provided on the carriage 305 as opposed to each other on either side in the vertical direction of a projection optical system 302 consisting of two projection optic series (or imaging optic series) 302A and 302B (see FIGS. 14A to 14E).

Here, each of the two projection optic series 302A and 302B includes a plurality of projection optical systems arranged in the Y direction in FIG. 13 (direction perpendicular to the plane of the figure) at predetermined intervals, and the projection optical system which constitutes the projection optic series 302A and the projection optical system which constitutes the projection optical series 302B are arranged to deviate from each other by a predetermined distance in the Y direction. That is, images projected on the photosensitive substrate 304 through all of the projection optical systems, respectively, are located in a so-called zigzag manner and so that edge portions in the Y direction of adjacent images in different series overlap with each other in the X direction. In this manner, the edge portion in each the projection area in the Y direction projected by the projection optical system for constituting the projection optic series 302A (or 302B) is subjected to overlap exposure with the edge portion in the each projection area in the Y direction projected by the projection optical system for constituting the projection optic series 302B (or 302A), whereby a large area can be exposed in the Y direction by single scan as a result.

In the case of this scanning exposure apparatus 301, a carrying system (not shown) for carrying the mask 303 and the photosensitive substrate 304 to holders 303A and 304A is not set on the both sides of the projection optical system 302 along the X direction, but is only on one side thereof. This means that after completion of the exposure with the mask 303 and the photosensitive substrate 304 being mounted on the holders 303A and 304A, the carriage 305 must be moved again to the position of the carrying system in order to change the photosensitive substrate, and the like, with next ones. In this scanning exposure apparatus 301, during a period when the carriage 305 is moved to be scanned from the position of the carrying system 301 located off the projection optical system 302 past the position of the projection optical system 302 (projection area) to an exposure start position (that is, during a period of go scan), a relation of relative position between the mask 303 and the photosensitive substrate 304 is measured so as to perform the relative positional alignment in the two-dimensional directions perpendicular to the optical axis of the projection optical system, based on the result of said measurement, and then, when the carriage is scanned in the backward direction (return scan), the patterns formed on the mask 303 are subjected to projection exposure on the photosensitive substrate 304 while the relative position between the mask and the photosensitive substrate relative to the direction of the optical axis and an inclination thereof are adjusted (focus correction).

As described, the scanning exposure apparatus 301 as described in the present embodiment has the detection period of the relation of the relative position during the go scan, which is an essential scan period, and is arranged to detect the relation of the relative position between the mask 303 and the photosensitive substrate 304 during this period, whereby it can follow a steep change of flatness in the mask 303 and the photosensitive substrate 304 without a decrease of throughput.

Next described are elements in the scanning exposure apparatus 301 more specifically.

The above-mentioned mask 303 and photosensitive substrate 304 are fixed to the carriage 305 of a U-shaped cross section through the respective holders 303A and 304A. This carriage 305 is mounted on a main body 306 so as to be movable along rails 306A, and is arranged so that synchronous scan of the mask 303 and the photosensitive substrate 304 is achieved by movement of this carriage 305.

An illumination optical system 306B is formed at a position corresponding to the projection optic series 302A and 302B above the carriage 305, and this illumination optical system 306B is retained by the main body 306 through an unrepresented retaining member, and is arranged to illuminate the original patterns formed (or written) on the mask 303 with illumination light emitted from the illumination optical system 306B.

In the present embodiment, there are provided first and second position detectors prepared for accurately positioning the mask 303 and the photosensitive substrate 304.

The first position detector is composed of an alignment sensor 307 to be used in measuring a relative position between the mask 303 and the photosensitive substrate 304 in the two-dimensional directions of X and Y (two-dimensional directions perpendicular to the optical axis of the projection optical system) and an alignment detection system 309 for processing a detection signal of this alignment sensor 307. The alignment sensor 307 is fixed together with the projection optical system 302 to the main body 306, and is arranged to measure marks for measurement of relative position (hereinafter referred to as "alignment marks") which are located at arbitrary positions in the scan direction (X direction) of the mask 303 and the photosensitive substrate 304. In the present embodiment, a main component of the alignment sensor 307 is a CCD camera which is arranged to output an image signal of an image pick-up plane. An image signal output from this alignment sensor 307 is processed in the alignment detection system 309, and a positional relation between alignment marks (deviation) respectively formed on the mask 303 and the photosensitive substrate 304 is detected.

The second position detector is composed of a focus sensor 308 to be used in measuring a relative position between the mask 303 and the photosensitive substrate 304 in the Z-axis (direction of the optical axis of the projection optical system) (see FIG. 14A) and a focus detection system 310 for processing a detection signal of this focus sensor 308. The focus sensor 308 is composed of two optical elements, i.e., a light-emitting device 308A and a light-receiving device 308B. An illumination light emitted in a slit configuration from the light-emitting device 308A is applied onto the surfaces of the mask 303 and the photosensitive substrate 304, and a slit image formed on each surface is re-imaged on the light-receiving device 308B so as to output a defocus signal corresponding to re-imaging position of each image. The focus detection system 310 is arranged to detect amounts of positional deviations of the mask 303 and the photosensitive substrate 304, respectively, from the reference point in the direction of the optical axis.

In the present embodiment, there are a plurality of focus sensors 308 arranged along the Y-axis direction. Also, these plural focus sensors 308 are arranged so that a straight line connecting detecting points by the focus sensors 308 falls between two straight lines connecting projection areas respectively by the projection optic series 302A and 302B.

At an output stage of the detection systems 309 and 310, the memory device 311 is provided as memory means, and a memory medium such as a fixed disk is provided in this memory device 311, and is arranged to store results of detection obtained at measurement points by the alignment sensor 307 and the focus sensor 308, i.e., the first positional information S1 and the second positional information S2.

In the present embodiment, a control system 312 is provided as control means for finely adjusting the holders 303A and 304A, based on the positional information stored in the memory device 311, or for controlling a movement of the carriage 305. This control system 312 is, in the present embodiment, provided with a function of producing a correction map to be described later, based on the second positional information S2 which is a result of the detection with respect to the direction of the optical axis so as to store said map in the memory device 311.

The above-mentioned drive system 313 is arranged to finely drive the holder 303A in the X, Y and θ (a rotation around the Z axis) directions, and the drive system 314 is arranged to finely drive the holder 304A in the X, Y and Z directions and to adjust an inclination thereof relative to the Z axis. Further, the drive system 315 drives the carriage 305 in the scan direction (X direction). Accordingly, the control system 312 makes the drive systems 313 and 314 perform the alignment between the mask 303 and the photosensitive substrate 304 and makes the drive system 314 perform focus and leveling correction.

Next, described using FIGS. 14A to 14E is an example of a sequential scanning exposure operation by the scanning exposure apparatus 301 of the present embodiment arranged in the above structure.

Figure 14A:
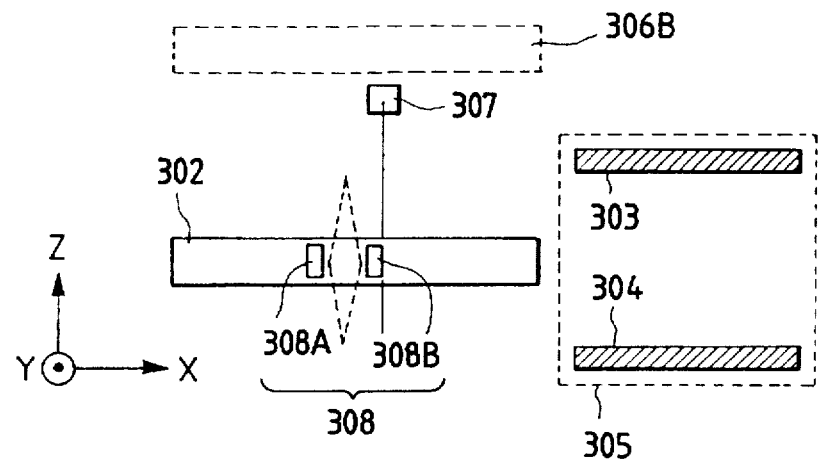
FIGS. 14A to 14E are schematic drawings to illustrate the scanning exposure.
Figure 14B:
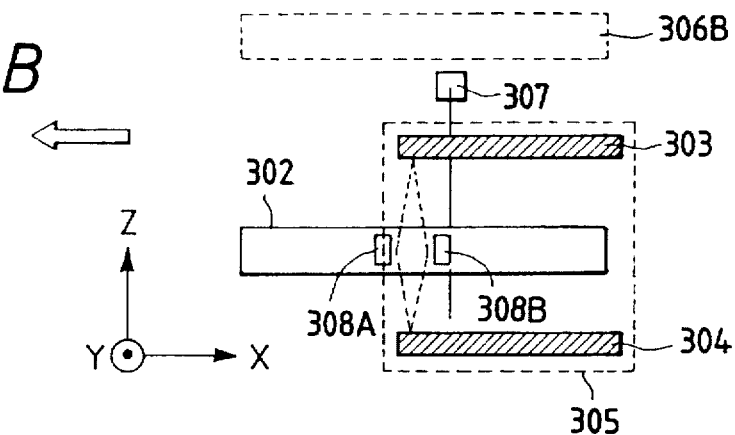
Figure 14C:
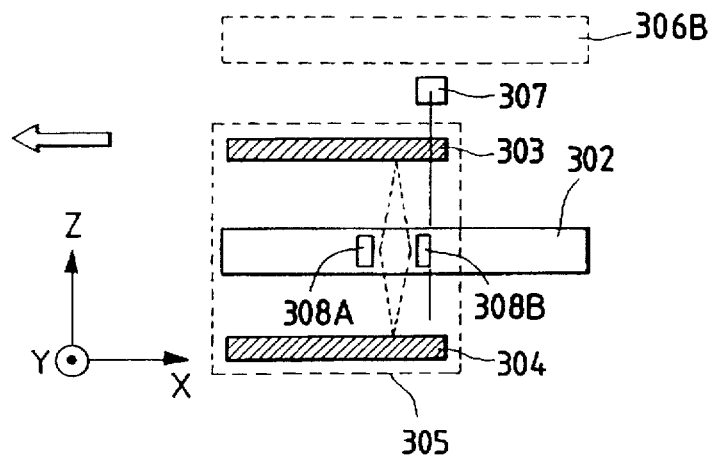

At initial setting, the carriage 305 is first stopped at a position off the projection optical system 302, as shown in FIG. 14A. When the mask 303 and the photosensitive substrate 304 are mounted from the carrying system on the holders 303A and 304A of the carriage 305 stopped at this position, the drive system 315 is controlled by the control system 312 to start carrying the carriage 305 to the exposure start position. The carrying direction at this time is the direction shown by the bold arrow in FIGS. 14B and 14C. This movement of the carriage 305 effects synchronous movement of the mask 303 and the photosensitive substrate 304.

During this go scan, the control system 312 successively measures by using the focus sensor 308 the separation along the optical axis between the mask 303 and the photosensitive surface 304 at constant measuring intervals or positions in the scan direction, which are preliminarily set, based on the data stored in the memory device 311. The control system 312 temporarily stops the carriage 305 through the drive system 315 at each of positions of an arbitrary number of alignment marks (alignment points) which are preliminarily set similarly, so as to measure a relative positional deviation between the mask 303 and the photosensitive substrate 304 by using the alignment sensor 307 after controlling the drive system 314 to properly set a relative distance and inclination between the mask 303 and the photosensitive substrate 304 in the direction of the optical axis (that is, focus adjustment) based on the positional information from the detection system 310 at each position (especially a sensor output in the vicinity of the alignment mark). Since the alignment processing is conducted after the focusing operation (focus adjustment) in this manner, if there is an inclination error relative to the optical axis of the illumination light flux, an alignment measurement can be conducted in a best condition without an influence of such error. Upon completion of the alignment measurement, while maintaining the position and the inclination of the photosensitive substrate 304 along the optical axis, the control system 312 drives the carriage 305 again by using the drive system 315, and subsequently, repeats the above-mentioned operation as previously set. Since the focusing operation is performed at each alignment position prior to the alignment measurement as described above to thereby change the position of the holder 304A for holding the photosensitive substrate 304, the reference is changed from that for a measurement result at the position immediately before (a distance between the mask 303 and the photosensitive substrate 304 along the optical axis) so that there arises a problem that the measurement result is discontinuous to subsequent measurement results. However, troubles which may be caused by this discontinuance of measurement results can be solved in the present embodiment by a unique arrangement, which will be described afterward.

Figure 14D:
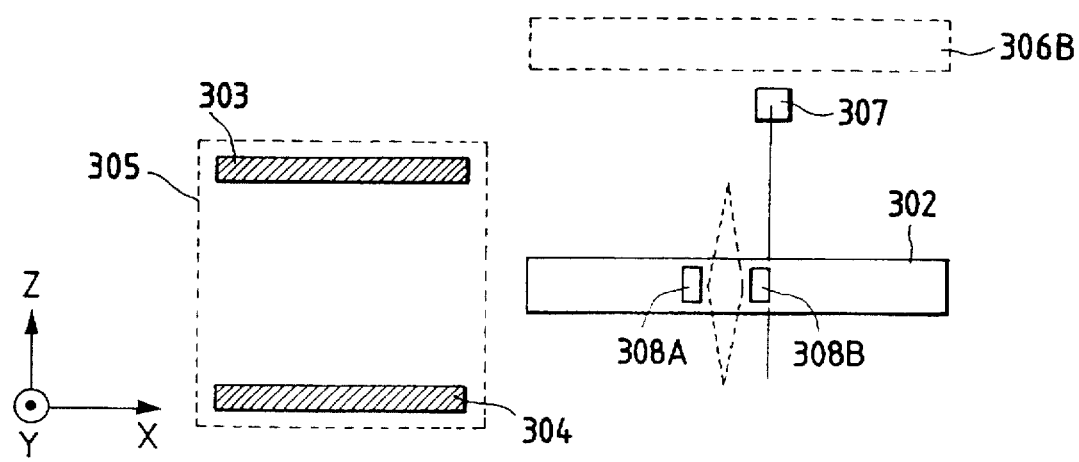
Figure 14E:
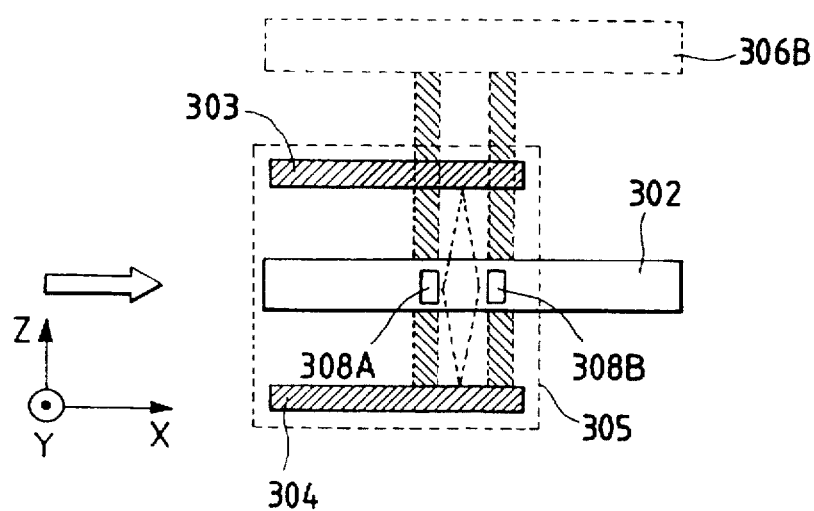

Upon completion of the measurement of the separation along the optical axis and the positions of alignment marks, the control system 312 stops through the drive system 315 the carriage 305 at a position where the mask 303 and the photosensitive substrate 304 are completely away from the projection optical system 302, as shown in FIG. 14D, in order to start exposure of mask patterns to the photosensitive substrate 304 by backward scan (return scan).

At the same time, the control system 312 derives elements of shift, rotation, magnification, orthogonality (inclination of the axis perpendicular to the scan direction), etc., by a technique using the method of least squares from the first positional information which is the information on the relative positional relation between the mask 303 and the photosensitive substrate 304 in the two-dimensional direction of X and Y obtained by the measurements of the plurality of alignment marks and stored in the memory device 311, and, based thereon, supplies a control signal to the drive system 313 to correct the setting position of the holder 303A, thereby correcting the positional deviation of the mask 303 relative to the photosensitive substrate 304 (that is, to perform the alignment).

On this occasion the control system 312 also corrects the magnification and orthogonality of the position of a transferred image relative to the scan direction through a magnification adjusting mechanism (not shown) provided in the projection optical system 302, an image shifter mechanism (not shown) for adjusting the position of the transferred image, and an image rotating mechanism (not shown) for rotating the transferred image.

Further, in the present embodiment, in a state in which the carriage 305 is stopped at this exposure start position, the control system 312 produces a correction map which represents appropriate correction values on the relative positional relation between the mask 303 and the photosensitive substrate 304 related to the optical axis at an arbitrary position, based on the second positional information which contains measurement results of the plurality of focus sensors 308 stored in the memory device 311.

Production of this correction map will be visually explained by using FIGS. 15A to 15E.

It is assumed that the measurement by the focus sensor 308 is started in a state in which the holder 304A for holding the photosensitive substrate 304 is set at a neutral position of the drive system 314. In FIGS. 15A to 15C, "displacement amounts (sensor outputs) of the mask 303 and the photosensitive substrate 304 from the proper separation along the optical axis" are plotted along the ordinate, and "the positions of the mask 303 and the photosensitive substrate 304 passing the projection area during the carrying operation" along the abscissa of the same coordinate system, with the start point A as a position of delivery with the carrying system and an end point E as the scan exposure start position, respectively.

Here, in order to simplify the description, an example is arranged so that the photosensitive substrate 304 has unevenness in the form of a sine wave and, on the other hand, the mask 303 has the unevenness in the form of a sine wave with a phase shifted by 180° therefrom, as shown in FIG. 15A.

Figure 1:
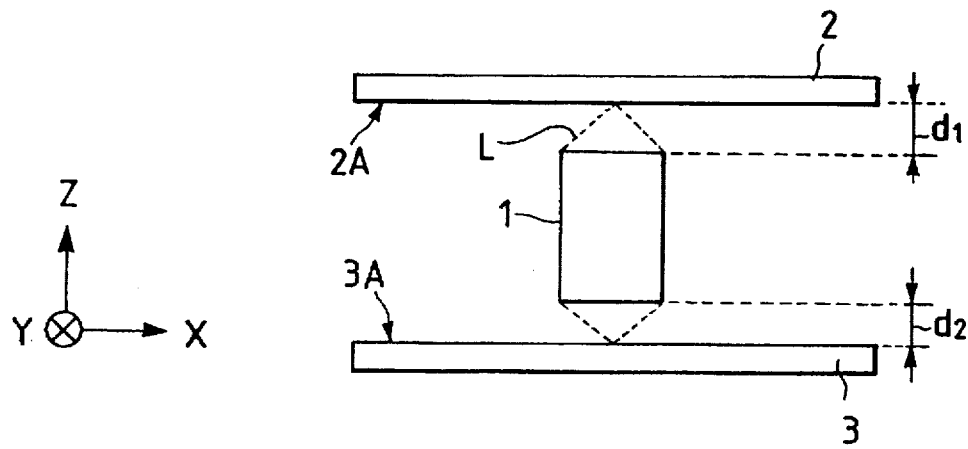
FIG. 1 is a schematic drawing to illustrate scanning exposure by the scanning exposure apparatus.
Figure 2:
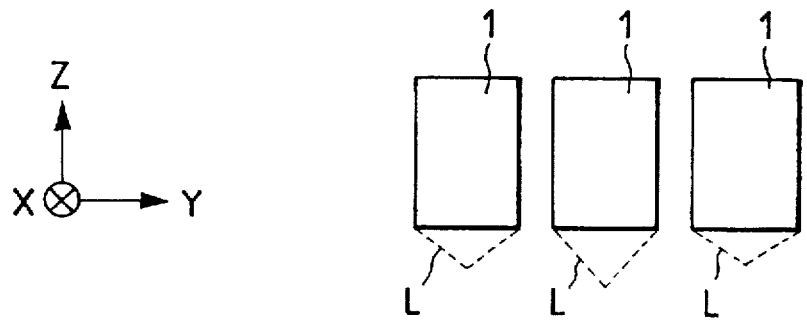
FIG. 2 is a schematic drawing to show variations in focal length of projection optical system.

The measurement by the focus sensor 308 is operated continuously as long as possible, so as to conduct the alignment measurement for measuring a relative positional relation between the mask 303 and the photosensitive substrate 304 on the X and Y plane at the point B and the point D in the figure. 1) For a distance up to the point B which is the first alignment point (the distance from A to B), a sensor output indicating the position of the photosensitive substrate 304 along the optical axis changes as the dotted line g shown in FIG. 15A. 2) At the point B which is the first alignment position, since a focusing operation is performed prior to the alignment measurement, the position of the holder 304A for holding the photosensitive substrate 304 is moved in such a manner that the distance between the mask 303 and the photosensitive substrate 304 becomes a predetermined value (designed value). As a result, as shown in FIG. 15B, a sensor output for indicating the position of the photosensitive substrate 304 along the optical axis (indicated by the dotted line g') coincides with a sensor output indicating the position of the mask 303 along the optical axis (indicated by the solid line h). On this occasion, the control system 312 makes the memory device 311 store an amount of control of the drive system 314 corresponding to the first movement amount which is typically represented by a (a movement amount along the optical axis (in the vertical direction) and an amount of inclination)

3) Upon completion of the alignment measurement at the first alignment position (distance from the point B to the point D), the relative distance between the mask 303 and the photosensitive substrate 304 is measured again, and the sensor output g' as indicated in FIG. 15B is recorded.

4) At the point D which is the second alignment position, since the focusing operation is performed in the same manner as that at the first alignment position, a sensor output indicating the position of the photosensitive substrate 304 along the optical axis (indicated by the dotted line g") coincides with the sensor output indicating the position of the mask 303 along the optical axis (indicated by the solid line h). In the same manner, the control system 312 makes the memory device 311 store an amount of control of the drive system 314 corresponding to the second movement amount (a movement amount in the direction of the optical axis (in the vertical direction) and an amount of inclination) typically represented by β on this occasion.

5) Upon completion of the alignment measurement at the second alignment position (distance from the point D to the point E), the relative distance between the mask 303 and the photosensitive substrate 304 is measured again and the sensor output g" as shown in FIG. 15C is recorded.

A series of these sensor outputs are briefly summarized in FIG. 15D, and the discontinuous sensor outputs (g, g' and g") are obtained on the side of the photosensitive substrate 304 with respect to the sensor output (h) on the side of the mask 303. Upon completion of the go scan, sensor outputs as shown in this FIG. 15D are stored in the memory device 311 as a data map.

Then, the control system 312 corrects a data map containing the sensor outputs showing the position of the photosensitive substrate 304 along the optical axis, out of said data map stored in the memory device 311, by using the control amount of the drive system 314 corresponding to the above-mentioned first and second movement amounts a and p, so as to produce a correction map for the position of the photosensitive substrate 304 along the optical axis which is constituted by such continuous data, as shown in FIG. 15E.

Then, upon completion of the production of this correction map, the control system 312 starts scan of the carriage 305 along the direction indicated by the bold arrow, so as to successively perform projection exposure of the images of patterns formed on the mask 303 to the photosensitive substrate 304. During this exposure, both or either one of the distance between the mask 303 and the photosensitive substrate 304 along the optical axis and an angle of inclination thereof relative to the optical axis is successively corrected, based on the above-mentioned correction map. Note that the angle of inclination may be provided in a direction along the scan direction, or may be provided in a direction perpendicular to the scan direction. In addition, by using measured values of the focus sensor 308 which are obtained during exposure, the control in accordance with the correction map can be effected more securely.

Meanwhile, after completion of the scan of the carriage 305 up to the position of the carrying system, the control system 312 stops the carriage 305 to interchange the mask 303 and the photosensitive substrate 304 currently set in the holders 303A and 304A with new mask 303 and photosensitive substrate 304 for the next exposure. The above operation is a cycle of exposure operation.

As described above, since the present embodiment is arranged to perform a focus adjustment prior to the measurement of an alignment mark position of the mask 303 and the photosensitive substrate 304 during the go scan of the carriage 305 when such measurement is to be performed, the alignment measurement can be performed accurately even when there are generated errors in an inclination of the illumination light relative to the optical axis, whereby a positioning between the mask 303 and the photosensitive substrate 304 is accurately performed by the method of least squares, or the like. Also, when a distance between the photosensitive substrate 304 and the mask 303 in the direction of the optical axis and an inclination relative to the optical axis are to be corrected during the scanning exposure, since necessary data is preliminary stored prior to this correction and a correction map is already produced, the photosensitive substrate 304 can be controlled to be always at an appropriate position relative to the mask 303 even if a partial sharp unevenness is present on the photosensitive substrate 304, whereby the exposure can be performed without imaging errors. Also in this case, since no complex statistical processing is required during the scanning exposure, the scanning speed during the exposure can be increased. Accordingly, a throughput can be improved as compared with those heretofore, and the exposure can be effected without a fear of deterioration in the resolution.

Also, the present embodiment employs, as the second detector for detecting the relative position between the mask 303 and the photosensitive substrate 304 in the direction of the optical axis, a detector of a type which separately measures and stores the positions of the mask 303 and the photosensitive substrate 304 and obtains a relative distance between the mask and the photosensitive substrate by calculating results of the measurement. Therefore, if a measuring reference immediately before is changed by a movement of at least either one of the mask 303 and the photosensitive substrate 304 in the direction of the optical axis following the focusing control so as to make measurement results discontinuous, these discontinuous measurement results can be corrected on the basis of the movement amounts (correction amounts) of both or one of said mask 303 and the photosensitive substrate 304 in the direction of the optical axis and converted into continuous results by the single reference. An accuracy in focusing control during scanning exposure is not degraded by such conversion.

As clearly seen from the above description, in the present embodiment, the first adjuster is constituted by the drive system 313, and the second adjuster by the drive system 314, respectively. And the first, second and third controllers are constituted by the control system 312.

The description relates to a pair of sensor outputs in the above embodiment. However, when there are provided a plurality of sensors, it is possible to easily convert discontinuous outputs into a continuous one based on the first and second movement amounts and a layout of the sensors in the same manner.

The description using FIGS. 15A to 15E in the above embodiment assumes two alignment positions. However, the present invention is not limited to this. It is apparently possible to set an arbitrary number of alignment positions, regardless of the set number of positions, by storing movement amounts at the respective positions.

In the above embodiment, the description relates to a case where both or one of the distance between the mask 303 and the photosensitive substrate 304 in the direction of the optical axis and the angle of inclination relative to the optical axis is successively corrected. However, each of the projection optical systems constituting the projection optical system 302 has a focus height and range (depth of focus) for achieving a best resolving power, and therefore, the control system 312 may correct the distance between the mask and the photosensitive substrate in the direction of the optical axis and the inclination at the exposure start position in such a manner that both the mask 303 and the photosensitive substrate 304 are set to be within the depth of focus, taking the above conditions into consideration. In this case, the control system 312 produces such an approximate plane, as a reference surface to the mask 303, that both the mask 303 and the photosensitive substrate 304 are set within the depth of focus, derives by the method of least squares the focus height of the photosensitive substrate 304 (or the mask 303) and an inclination of a surface of a region including all projection areas of the plurality of projection optical systems, based on the above-mentioned correction map (or the data map comprising the sensor outputs on the mask side), and controls the drive system 314 so that the inclination of the photosensitive substrate 304 coincides with that of the approximate plane.

In this case, since the relative positional relation between the mask 303 and the photosensitive substrate 304 is corrected in the best condition by the previously described correction processing, there is no possibility of imaging errors or the like if the scanning exposure is executed while maintaining the positions of the mask 303 and the photosensitive substrate 304 in the direction of the optical axis and the inclination.

By the way, in the above-described embodiment, during the correction of scanning exposure, the position of the mask 303 may be fixed so as to successively correct the height, etc., of the photosensitive substrate 304, or the photosensitive substrate 304 may be fixed so as to correct the mask 303 side, or the mask 303 and the photosensitive substrate 304 may be corrected simultaneously. In any case, the exposure can be made without a possibility of degradation of resolution.

The above-described embodiment was an example in which the invention was applied to the scanning exposure apparatus using two projection optic series, but the present invention is by no means limited to it; for example, the invention can be applied to cases of scanning exposure apparatus using a single projection optical system or a series of projection optical systems or cases of scanning exposure apparatus using three or more series of projection optical systems. In either case scanning exposure can be achieved with higher throughput and with less degradation of resolution as compared with those heretofore.

Further, the above-described embodiment showed an example in which the alignment sensor 307 consisted of the CCD camera, but the present invention is not limited to it; the present invention may employ an alignment sensor of the laser interferometric alignment method, instead of this. Even in this case, if inclination errors are present relative to the optical axis of the illumination light, this does not influence the alignment measurement and an accurate alignment measurement can be executed.

Note that the above-described embodiment shows an example in which the positional information in the direction of the optical axis is measured without use of the projection optic series 302A and 302B, i.e., in which the measurement position is located near the exposure region, but the present invention is not limited to it; the invention can be applied to cases where the position in the direction of the optical axis is measured through the projection optic series 302A and 302B or where the measurement position is located within the exposure region. In such cases, the correction accuracy can be further enhanced because the positional information in the exposure region can be attained as actually measured values.

Incidentally, in the exposure processing which does not require an alignment operation, the carrying system does not have to be stopped when the mask 303 and the photosensitive substrate 304 are carried to the exposure start position and only the relative position (separation) between the mask and the photosensitive substrate in the direction of the optical axis is detected and stored in the memory device 311.

Therefore, it is intended that the invention not be limited to the preferred embodiments described herein, but that the invention will include all embodiments falling within the scope of the appended claims.

What is claimed is:

1. A scanning exposure apparatus, which is arranged to illuminate a mask, to project an image of said mask through a projection optical system onto a photosensitive substrate, and to move said mask and said photosensitive substrate relative to said projection optical system, thereby effecting exposure of an entire surface of said mask on said photosensitive substrate, and which comprises:

a holding member which holds said mask and said photosensitive substrate integrally;

a position detector which detects a relative positional relation between said mask and said photosensitive substrate while said mask and said photosensitive substrate are carried by driving said holding member past a projection region of said projection optical system to an exposure start position;

a position correcting device which corrects the relative positional relation between said mask and said photosensitive substrate; and a controller which is connected to said position correcting device and controls said position correcting device to correct the relative positional relation between said mask and said photosensitive substrate, based on positional information obtained by said position detector, while said mask and said photosensitive substrate are stopped at said exposure start position and/or during said exposure.

2. A scanning exposure apparatus according to claim 1, wherein said positional information comprises first positional information related to a direction perpendicular to an optical axis of said projection optical system and second positional information related to a direction of the optical axis of said projection optical system.

3. A scanning exposure apparatus according to claim 2, wherein said first positional information is a relative position between said mask and said photosensitive substrate and wherein said second positional information is a relative position in said direction of the optical axis between said mask and said photosensitive substrate and an amount of relative inclination between said mask and said photosensitive substrate.

4. A scanning exposure apparatus according to claim 3, wherein said controller controls said position correcting device, based on the relative position between said mask and said photosensitive substrate while said mask and said photosensitive substrate are stopped at said exposure start position, thereby correcting the positional relation related to the direction perpendicular to the optical axis of said projection optical system out of the positional relation between said mask and said photosensitive substrate and wherein during said exposure, said controller controls said position correcting device, based on the relative position related to said direction of the optical axis between said mask and said photosensitive substrate and/or the amount of relative inclination between said mask and said photosensitive substrate, thereby correcting the positional relation related to the direction of the optical axis of said projection optical system out of the positional relation between said mask and said photosensitive substrate.

5. A scanning exposure apparatus according to claim 4, further comprising a memory that retains a data map obtained based on said positional information at arbitrary positions in a scan direction, detected by said position detector.

6. A scanning exposure apparatus according to claim 1, wherein said position correcting device corrects, based on said mask, an error related to the positional relation between said photosensitive substrate and said mask with respect to the direction of an optical axis of said projection optical system.

7. A scanning exposure apparatus according to claim 5, wherein said position correcting device produces a correction map representing correction values at said arbitrary positions based on said positional information read out from said data map, and successively corrects the positional relation between said mask and said photosensitive substrate in accordance with said correction map during said exposure.

8. A scanning exposure apparatus according to claim 5, wherein said position correcting device produces a correction map representing correction values at said arbitrary positions based on said positional information read out from said data map, and successively corrects the positional relation between said mask and said photosensitive substrate in accordance with said correction map and positional information detected in real time by said position detector, during said exposure.

9. A scanning exposure apparatus, which is arranged to illuminate a plurality of regions on a mask, to project respective images of said plurality of regions through a plurality of projection optical systems onto a photosensitive substrate, and to move said mask and said photosensitive substrate relative to said plurality of projection optical systems, thereby effecting exposure of an entire surface of said mask on said photosensitive substrate, and which comprises:

a measuring device which measures a relative separation between said mask and said photosensitive substrate at each of arbitrary positions on said mask and said photosensitive substrate while said mask and said photosensitive substrate are synchronously carried in the same direction to an exposure start position;

a position correcting device which drives said mask and/or said photosensitive substrate to correct a relative positional relation between said mask and said photosensitive substrate; and a controller which is connected to said position correcting device and controls said position correcting device during said exposure, based on measurement results of said measuring device, so that the relative separations between said mask and said photosensitive substrate, related to said plurality of regions from which an image of said mask is projected, satisfy a predetermined relation.

10. A scanning exposure apparatus according to claim 9, wherein each of said plurality of projection optical systems has an error related to a respective one of their focal lengths and wherein said controller performs said control, based on said errors related to said focal lengths.

11. A scanning exposure apparatus according to claim 10, wherein said position correcting device has a drive direction which is at least one of a direction perpendicular to a surface of said mask and/or a surface of said photosensitive substrate, a first rotational direction related to a scan direction, and a second rotational direction related to a direction perpendicular to said scan direction.

12. A scanning exposure apparatus, which is arranged to successively transfer patterns of a mask onto a photosensitive substrate through a projection optical system while synchronously moving the mask and the photosensitive substrate in a predetermined scan direction, and which comprises:

a first position detector which detects a relative positional relation between said mask and said photosensitive substrate in two-dimensional directions perpendicular to the optical axis of the projection optical system;

a second position detector which detects a relative positional relation between said mask and said photosensitive substrate in the direction of said optical axis;

a first adjuster which adjusts the relative positional relation between said mask and said photosensitive substrate in the two-dimensional directions perpendicular to the optical axis;

a second adjuster which adjusts the relative positional relation between said mask and said photosensitive substrate with respect to the direction of the optical axis;

a first controller which is connected to said first position detector and said second position detector and controls said second adjuster to adjust the relative positional relation between said mask and said photosensitive substrate with respect to the direction of the optical axis at a predetermined alignment point while monitoring an output of said second position detector while said mask and said photosensitive substrate are synchronously carried past a projection region of said projection optical system to an exposure start position and thereafter makes said first position detector detect the relative positional relation between said mask and said photosensitive substrate in the two-dimensional directions perpendicular to said optical axis; and a second controller which is connected to said first position detector and controls said first adjuster to adjust the relative positional relation between said mask and said photosensitive substrate in the two-dimensional directions perpendicular to the optical axis, based on the relative positional relation, detected by said first position detector, between said mask and said photosensitive substrate in the two-dimensional directions perpendicular to said optical axis, after said mask and said photosensitive substrate are carried to the exposure start position and before the exposure starts.

13. A scanning exposure apparatus according to claim 12, further comprising:

a third controller which controls said second adjuster to adjust the relative positional relation between said mask and said photosensitive substrate with respect to the direction of the optical axis, based on an output from said second position detector during scanning-exposure of said mask and said photosensitive substrate.

14. A scanning exposure apparatus according to claim 13, further comprising:

a memory which stores an amount of control of said second adjuster when said first controller controlled said second adjuster, at said predetermined alignment point;

wherein said third controller controls said second adjuster during said scanning-exposure, based on the output from said second position detector and the amount of control of said second adjuster stored in said memory.

15. A scanning exposure apparatus according to claim 1, wherein said position detector detects said positional relation between said mask and said photosensitive substrate with respect to a direction perpendicular to an optical axis of said projection optical system with said mask and said photosensitive substrate stopped when detecting said positional relation.

16. A scanning exposure apparatus according to claim 1, wherein said position detector detects said positional relation between said mask and said photosensitive substrate with respect to the direction of an optical axis of said projection optical system, and wherein said position correcting device drives said photosensitive substrate in a first rotational direction related to a scan direction, and a second rotational direction related to a direction perpendicular to said scan direction.

17. A scanning exposure apparatus according to claim 9, wherein said controller sends, in advance of a control position where said control is to be performed, control data to said position correcting device.

18. A scanning exposure apparatus according to claim 9, further comprising:

a holding member which holds said mask and said photosensitive substrate integrally, wherein a scan is performed by moving said holding member, whereby said mask and said photosensitive substrate are moved synchronously.

19. A scanning exposure method for exposing patterns of a mask onto a photosensitive substrate, by holding said mask and said photosensitive substrate in such a manner that they face each other, and by moving them synchronously relative to a plurality of projection optical systems, the method comprising the steps of:

adjusting relative positional relation between said mask and said photosensitive substrate with respect to the directions of optical axes of said projection optical systems, at a predetermined alignment point while carrying said mask and said photosensitive substrate to an exposure start position;

detecting, after said adjusting, positional relation between said mask and said photosensitive substrate with respect to directions perpendicular to said optical axes, at said predetermined alignment point; and adjusting the positional relation between said mask and said photosensitive substrate with respect to the directions perpendicular to said optical axes.

20. A scanning exposure method according to claim 19, wherein said mask and said photosensitive substrate are stopped at said predetermined alignment point.

21. A scanning exposure method according to claim 19, wherein said step of adjusting the positional relation between said mask and said photosensitive substrate with respect to the directions perpendicular to said optical axes, is carried out before exposure is started.

22. A scanning exposure method according to claim 19, further comprising the step of:

adjusting relative positional relation between said mask and said photosensitive substrate with respect to the directions of the optical axes of said projection optical systems, after adjusting the positional relation between said mask and said photosensitive substrate with respect to the directions perpendicular to said optical axes.

23. A scanning exposure method according to claim 22, wherein said step of adjusting relative positional relation between said mask and said photosensitive substrate with respect to the directions of the optical axes of said projection optical systems, is performed during exposure.

24. A scanning exposure method according to claim 23, wherein said step of adjusting relative positional relation between said mask and said photosensitive substrate with respect to the directions of the optical axes of said projection optical systems, is performed based on said adjusting which was performed at least at said predetermined alignment point.

25. A scanning exposure method according to claim 19, wherein said mask and said photosensitive substrate are moved in the same direction.

26. A scanning exposure apparatus according to claim 1, further comprising a mask holder capable of moving while holding said mask, wherein said position correcting device is connected to said mask holder.

27. A scanning exposure apparatus according to claim 1, wherein said position detector optically detects the relative positional relation between said mask and said photosensitive substrate.

28. A scanning exposure apparatus according to claim 9, further comprising:

a mask holder capable of moving while holding said mask; and a substrate holder capable of moving while holding said photosensitive substrate, wherein said position correcting device is connected to at least one of said mask holder and said substrate holder.

29. A scanning exposure apparatus according to claim 9, wherein said measuring device optically detects the relative separation between said mask and said photosensitive substrate.

30. A scanning exposure apparatus according to claim 12, further comprising:

a mask holder capable of moving while holding said mask; and a substrate holder capable of moving while holding said photosensitive substrate, wherein said first adjuster is connected to at least one of said mask holder and said substrate holder.

31. A scanning exposure apparatus according to claim 12, further comprising a substrate holder capable of moving while holding said photosensitive substrate, wherein said second adjuster is connected to said substrate holder.

32. A scanning exposure apparatus according to claim 12, wherein said first and second position detectors are optical detectors.

33. A scanning exposure method for moving a mask and a photosensitive substrate synchronously, and effecting scanning exposure of an image of patterns of said mask on said photosensitive substrate, the method comprising the steps of:

detecting relative positional relation between said mask and said photosensitive substrate while carrying said mask and said photosensitive substrate integrally in a direction opposite to the direction in which said scanning exposure is effected; and correcting the relative positional relation between said mask and said photosensitive substrate, based on the relative positional relation between said mask and said photosensitive substrate obtained by said detecting step, while said mask and said photosensitive substrate are stopped at an exposure start position where said exposure is effected and/or during said exposure.

34. A liquid crystal display device which is manufactured by using the scanning exposure method according to claim 33.

* * * * *